(12) United States Patent
Maruyama

(10) Patent No.: US 9,772,377 B2
(45) Date of Patent: Sep. 26, 2017

(54) CIRCUIT DIVISION METHOD FOR TEST PATTERN GENERATION AND CIRCUIT DIVISION DEVICE FOR TEST PATTERN GENERATION

(71) Applicant: FUJITSU LIMITED, Kawasaki-shi, Kanagawa (JP)

(72) Inventor: Daisuke Maruyama, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 71 days.

(21) Appl. No.: 14/938,000

(22) Filed: Nov. 11, 2015

(65) Prior Publication Data

US 2016/0154056 A1 Jun. 2, 2016

(30) Foreign Application Priority Data

Dec. 1, 2014 (JP) .................................. 2014-243552

(51) Int. Cl.
*G06F 17/50* (2006.01)
*G01R 31/3183* (2006.01)

(52) U.S. Cl.
CPC . *G01R 31/318342* (2013.01); *G06F 17/5022* (2013.01); *G01R 31/318314* (2013.01); *G06F 17/5072* (2013.01); *G06F 17/5077* (2013.01); *G06F 17/5081* (2013.01)

(58) Field of Classification Search
CPC ............. G06F 17/5072; G06F 17/5077; G06F 17/5081; G06F 17/5022; G01R 31/328342; G01R 31/318314

USPC ....... 716/136, 116, 121, 122, 124, 125, 131, 716/111, 106; 703/15, 16
See application file for complete search history.

(56) References Cited

U.S. PATENT DOCUMENTS 6,330,429 B1 * 12/2001 He ........................ H04W 16/00
455/134

FOREIGN PATENT DOCUMENTS

JP 2000-207445 7/2000
JP 2001-60216 3/2001
WO WO 98/49576 11/1998

* cited by examiner

*Primary Examiner* — Phallaka Kik
(74) *Attorney, Agent, or Firm* — Staas & Halsey LLP

(57) ABSTRACT

A circuit division method for test pattern generation in which a computer performs processes of: acquiring, for each of a plurality of blocks included in a target circuit for test pattern generation, a first feature amount regarding a size of each block and a second feature amount regarding a function of the block; classifying the plurality of blocks into a plurality of groups so that blocks for which the acquired first feature amount is within a first predetermined range and the acquired second feature amount is within a second predetermined range belong to an identical group; and assigning, for each of the classified groups, each of the blocks included in the group to one of a plurality of divided circuits of a division number based on a ratio of the number of blocks included in the group to the division number by which the plurality of blocks are divided.

15 Claims, 31 Drawing Sheets

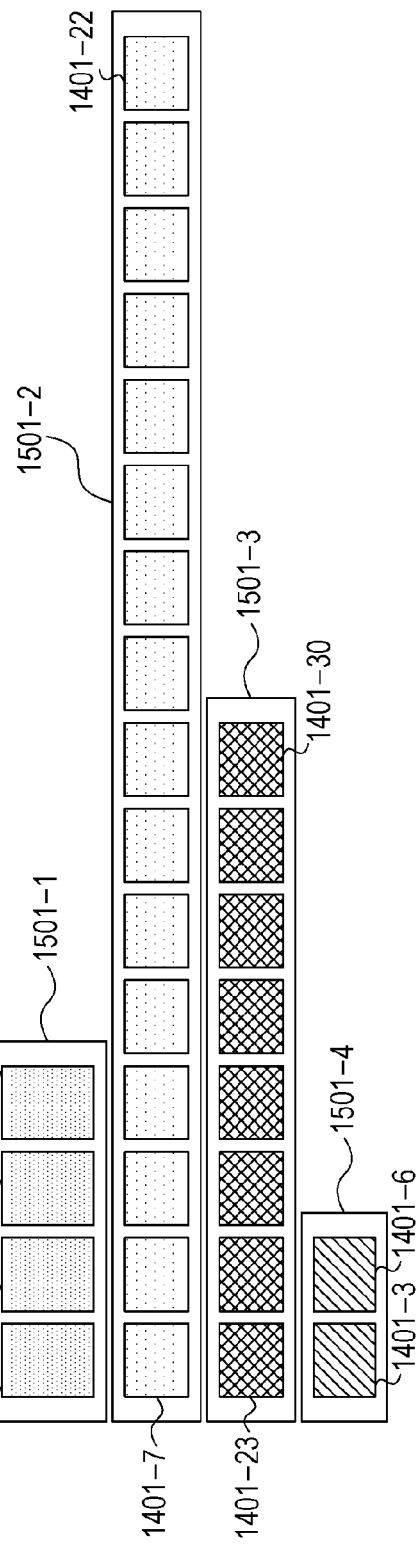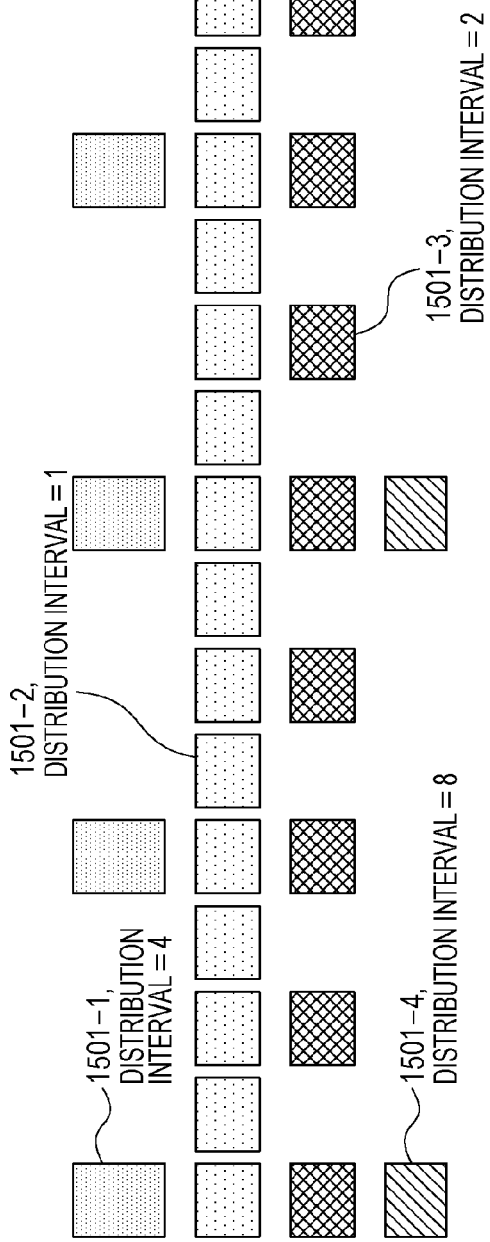

FIG. 17A

| BLOCKS | NUMBER OF NETS | NUMBER OF SCAN FFS | NUMBER OF TRACE NETS |
|---|---|---|---|
| BLOCK 1700-1 | 10,739,730 | 58,183 | 10,110,410 |
| BLOCK 1700-2 | 10,739,730 | 58,183 | 10,110,643 |
| BLOCK 1700-3 | 10,729,514 | 58,183 | 10,098,647 |
| BLOCK 1700-4 | 10,729,514 | 58,183 | 10,099,870 |
| BLOCK 1700-5 | 5,257,192 | 49,374 | 4,158,657 |
| BLOCK 1700-6 | 5,257,192 | 49,374 | 4,158,657 |
| BLOCK 1700-7 | 13,436,024 | 72,678 | 12,526,735 |
| BLOCK 1700-8 | 13,436,024 | 72,678 | 12,527,330 |
| BLOCK 1700-9 | 13,418,852 | 72,678 | 12,517,505 |
| BLOCK 1700-10 | 13,418,852 | 72,678 | 12,518,444 |
| ;; | | | |

FIG. 17B

| BLOCKS | NUMBER OF NETS | NUMBER OF SCAN FFS | NUMBER OF TRACE NETS |
|---|---|---|---|
| BLOCK 1700-7 | 13,436,024 | 72,678 | 12,526,735 |
| BLOCK 1700-8 | 13,436,024 | 72,678 | 12,527,330 |
| BLOCK 1700-9 | 13,418,852 | 72,678 | 12,517,505 |
| BLOCK 1700-10 | 13,418,852 | 72,678 | 12,518,444 |
| BLOCK 1700-1 | 10,739,730 | 58,183 | 10,110,410 |
| BLOCK 1700-2 | 10,739,730 | 58,183 | 10,110,643 |
| BLOCK 1700-3 | 10,729,514 | 58,183 | 10,098,647 |
| BLOCK 1700-4 | 10,729,514 | 58,183 | 10,099,870 |
| BLOCK 1700-5 | 5,257,192 | 49,374 | 4,158,657 |
| BLOCK 1700-6 | 5,257,192 | 49,374 | 4,158,657 |
| ;; | | | |

FIG. 17C

| BLOCKS | NUMBER OF NETS | NUMBER OF SCAN FFS | NUMBER OF TRACE NETS |
|---|---|---|---|
| -GROUP 1701-1 | | | |
| BLOCK 1700-7 | 13,436,024 | 72,678 | 12,526,735 |
| BLOCK 1700-8 | 13,436,024 | 72,678 | 12,527,330 |
| BLOCK 1700-9 | 13,418,852 | 72,678 | 12,517,505 |
| BLOCK 1700-10 | 13,418,852 | 72,678 | 12,518,444 |
| -GROUP 1701-2 | | | |
| BLOCK 1700-1 | 10,739,730 | 58,183 | 10,110,410 |
| BLOCK 1700-2 | 10,739,730 | 58,183 | 10,110,643 |
| BLOCK 1700-3 | 10,729,514 | 58,183 | 10,098,647 |
| BLOCK 1700-4 | 10,729,514 | 58,183 | 10,099,870 |
| -GROUP 1701-3 | | | |
| BLOCK 1700-5 | 5,257,192 | 49,374 | 4,158,657 |
| BLOCK 1700-6 | 5,257,192 | 49,374 | 4,158,657 |
| ;; | | | |

```
#! /usr/bin/env python3
# -*- coding: utf-8 -*-
def gcd(x, y):
   while(x % y):
      z = x % y
      x = y
      y = z
   return y
# ACQUISITION OF DISTRIBUTION INTERVAL
def get_width(part_no, BLOCK_no):
   # INITIALIZATION (WIDTH, EXTRA)
   width, extra_no = 0, 0
   # INDIVISIBLE
   if BLOCK_no == 1:
      extra_no = 1
   # EQUALLY ASSIGNABLE
   elif part_no % BLOCK_no == 0:
      width = part_no // BLOCK_no
   # EQUALLY UNASSIGNABLE
   else:
      # GENERATION OF EXTRA PARTITION
      s = BLOCK_no - extra_no
      while(s):
         g = gcd(part_no, s)
         if g != 1:
            width = part_no // g
            break
         extra_no = extra_no + 1
         s = BLOCK_no - extra_no
   return width, extra_no
# GENERATION OF MEMBER
def make_member(part_no, BLOCK_no, width, extra_no):
   member = []
   # BLOCKS ARE DIVIDED FOR no NUMBER AT width INTERVAL
   if width:
      rep = part_no // width
      no = BLOCK_no // rep
      for r in range(rep):
         subs = [(r*width+n+1) for n in range(no)]
         member.append(subs)
   # EXTRA
   subs = [(part_no+e+1) for e in range(extra_no)]
   member.append(subs)
   #
   return member
def main():
   # SAMPLE OF 16 DIVISIONS
   part_no = 16
   for BLOCK_no in range(1, 16+1):
      # ACQUISITION OF DISTRIBUTION INTERVAL
      width, extra_no = get_width(part_no, BLOCK_no)
      member = make_member(part_no, BLOCK_no, width, extra_no)
      # RESULT
      print(BLOCK_no, ':', 'width', width, 'extra', extra_no, ' ', end='')
      for m in member:
         print(m, end='')
      print()
if __name__ == '__main__':
   main()
```

```
1 : width 0 extra 1  [17]
2 : width 8 extra 0  [1][9][]
3 : width 8 extra 1  [1][9][17]
4 : width 4 extra 0  [1][5][9][13][]
5 : width 4 extra 1  [1][5][9][13][17]
6 : width 8 extra 0  [1, 2, 3][9, 10, 11][]
7 : width 8 extra 1  [1, 2, 3][9, 10, 11][17]
8 : width 2 extra 0  [1][3][5][7][9][11][13][15][]
9 : width 2 extra 1  [1][3][5][7][9][11][13][15][17]
10 : width 8 extra 0  [1, 2, 3, 4, 5][9, 10, 11, 12, 13][]
11 : width 8 extra 1  [1, 2, 3, 4, 5][9, 10, 11, 12, 13][17]
12 : width 4 extra 0  [1, 2, 3][5, 6, 7][9, 10, 11][13, 14, 15][]
13 : width 4 extra 1  [1, 2, 3][5, 6, 7][9, 10, 11][13, 14, 15][17]
14 : width 8 extra 0  [1, 2, 3, 4, 5, 6, 7][9, 10, 11, 12, 13, 14, 15][]
15 : width 8 extra 1  [1, 2, 3, 4, 5, 6, 7][9, 10, 11, 12, 13, 14, 15][17]
16 : width 1 extra 0  [1][2][3][4][5][6][7][8][9][10][11][12][13][14][15][16][]
```

FIG. 20A

| DIVIDED CIRCUITS | NUMBERS OF ACCUMULATIVE TRACE NETS |
|---|---|
| 1 | 0 |
| 2 | 0 |
| 3 | 0 |
| 4 | 0 |
| 5 | 0 |
| 6 | 0 |
| 7 | 0 |
| 8 | 0 |
| 9 | 0 |
| 10 | 0 |
| 11 | 0 |
| 12 | 0 |
| 13 | 0 |
| 14 | 0 |
| 15 | 0 |
| 16 | 0 |

FIG. 20B

| DIVIDED CIRCUITS | NUMBERS OF ACCUMULATIVE TRACE NETS | GROUP 1 |
|---|---|---|
| 1 | 12,526,735 | BLOCK 7 |
| 2 | 0 | |
| 3 | 0 | |
| 4 | 0 | |
| 5 | 12,527,330 | BLOCK 8 |
| 6 | 0 | |
| 7 | 0 | |
| 8 | 0 | |
| 9 | 12,517,505 | BLOCK 9 |
| 10 | 0 | |
| 11 | 0 | |
| 12 | 0 | |
| 13 | 12,518,444 | BLOCK 10 |
| 14 | 0 | |
| 15 | 0 | |
| 16 | 0 | |

FIG. 20C

| DIVIDED CIRCUITS | NUMBERS OF ACCUMULATIVE TRACE NETS | GROUP 1 | GROUP 2 |
|---|---|---|---|
| 1 | 12,526,735 | BLOCK 7 | |
| 2 | 10,110,410 | | BLOCK 1 |
| 3 | 0 | | |
| 4 | 0 | | |
| 5 | 12,527,330 | BLOCK 8 | |
| 6 | 10,110,643 | | BLOCK 2 |
| 7 | 0 | | |
| 8 | 0 | | |
| 9 | 12,517,505 | BLOCK 9 | |
| 10 | 10,098,647 | | BLOCK 3 |
| 11 | 0 | | |
| 12 | 0 | | |
| 13 | 12,518,444 | BLOCK 10 | |
| 14 | 10,099,870 | | BLOCK 4 |
| 15 | 0 | | |
| 16 | 0 | | |

FIG. 20D

| DIVIDED CIRCUITS | NUMBERS OF ACCUMULATIVE TRACE NETS | GROUP 1 | GROUP 2 | GROUP 3 |
|---|---|---|---|---|
| 1 | 12,526,735 | BLOCK 7 | | |
| 2 | 10,110,410 | | BLOCK 1 | |
| 3 | 4,158,657 | | | BLOCK 5 |
| 4 | 0 | | | |
| 5 | 12,527,330 | BLOCK 8 | | |
| 6 | 10,110,643 | | BLOCK 2 | |
| 7 | 0 | | | |
| 8 | 0 | | | |
| 9 | 12,517,505 | BLOCK 9 | | |
| 10 | 10,098,647 | | BLOCK 3 | |
| 11 | 4,158,657 | | | BLOCK 6 |
| 12 | 0 | | | |
| 13 | 12,518,444 | BLOCK 10 | | |
| 14 | 10,099,870 | | BLOCK 4 | |
| 15 | 0 | | | |
| 16 | 0 | | | |

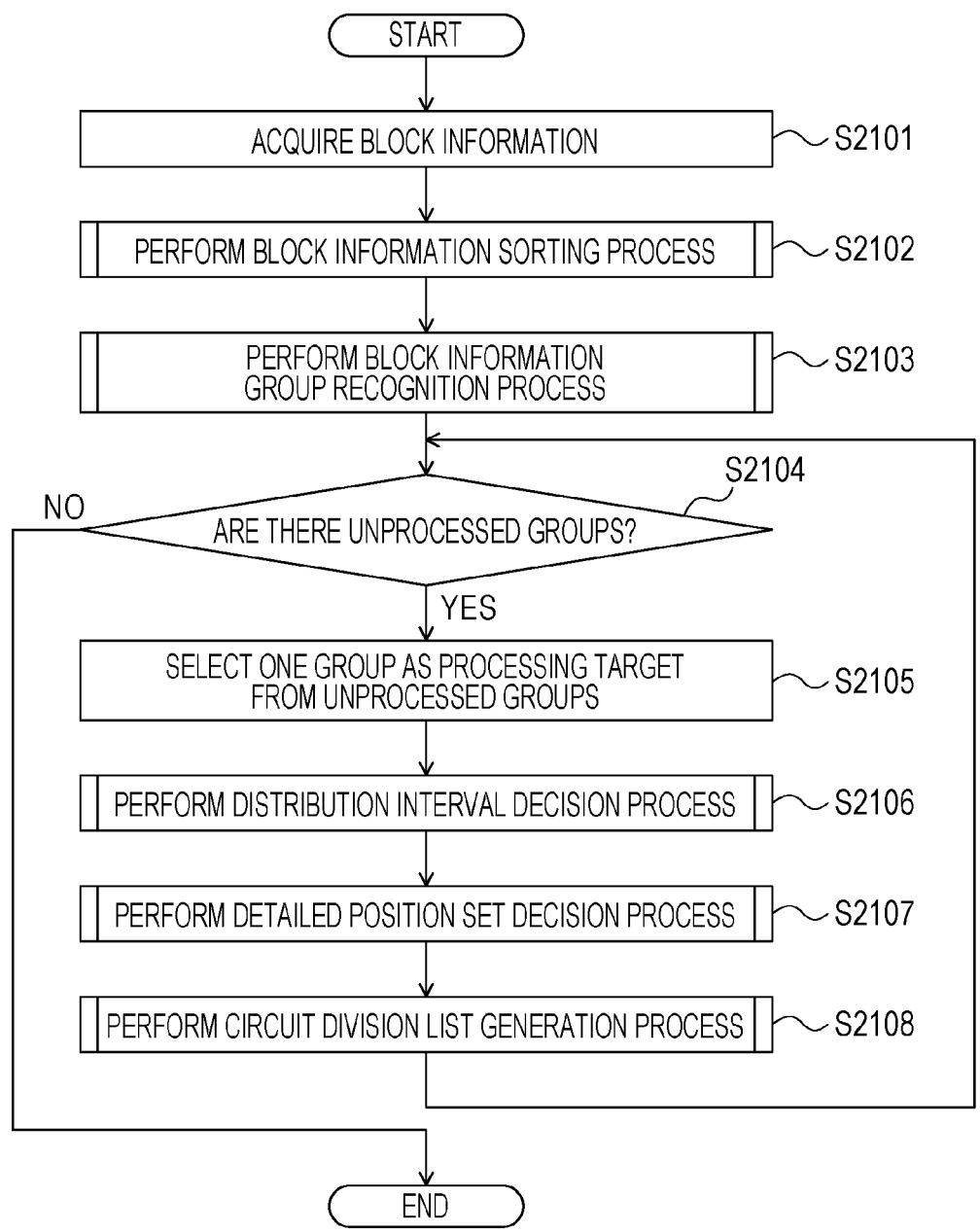

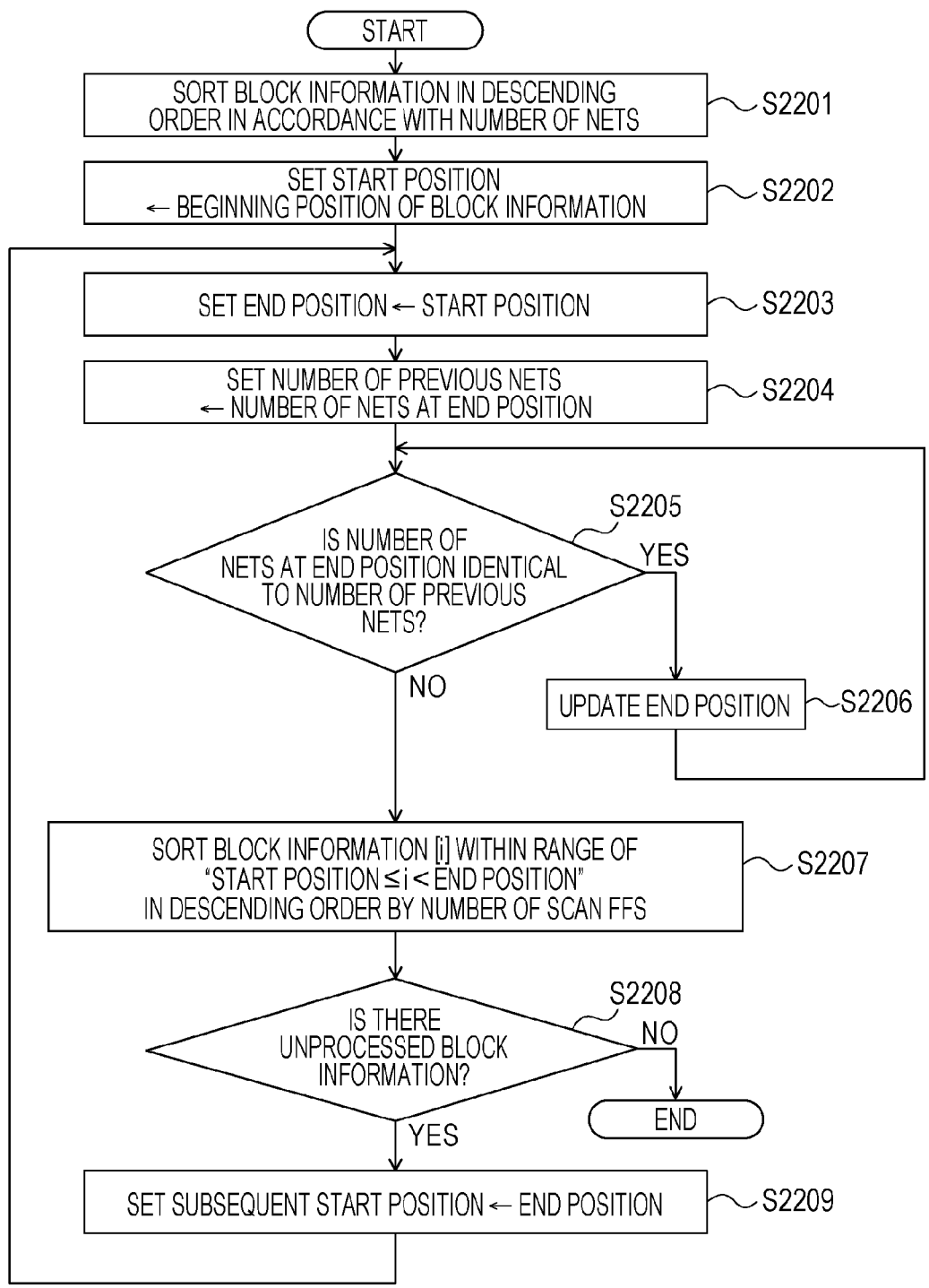

FIG. 30A
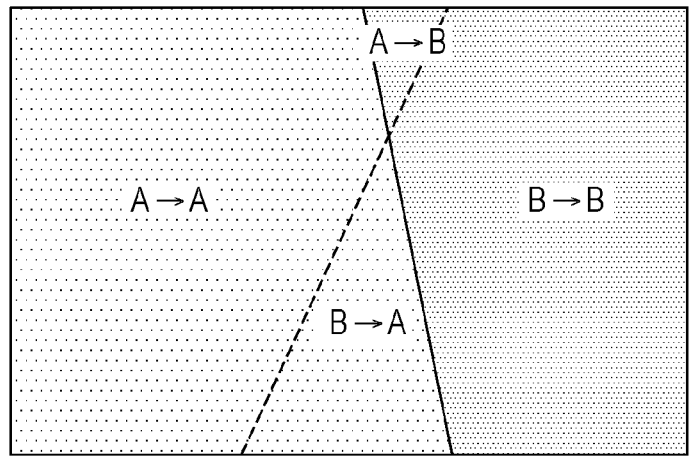
FIG. 30B
RELATED ART
FIG. 30C
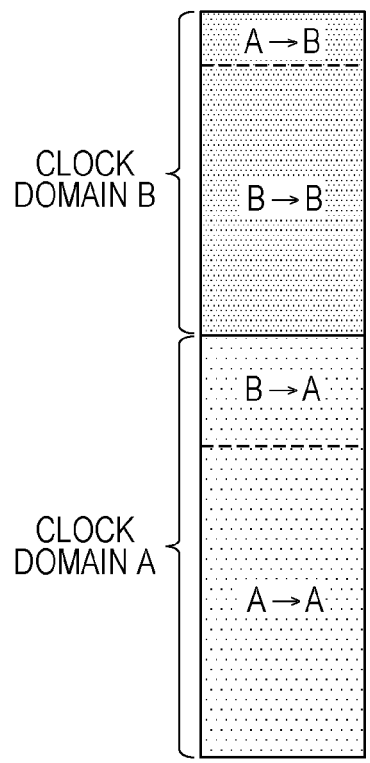
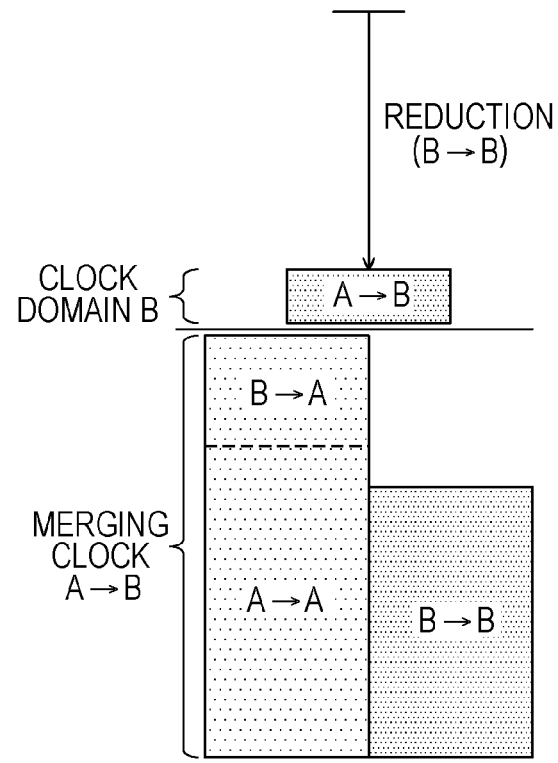

CIRCUIT DIVISION METHOD FOR TEST PATTERN GENERATION AND CIRCUIT DIVISION DEVICE FOR TEST PATTERN GENERATION

CROSS-REFERENCE TO RELATED APPLICATION

This application is based upon and claims the benefit of priority of the prior Japanese Patent Application No. 2014-243552, filed on Dec. 1, 2014, the entire contents of which are incorporated herein by reference.

FIELD

The embodiment discussed herein relates to a circuit division method for test pattern generation, a circuit division program for test pattern generation, and a circuit division device for test pattern generation.

BACKGROUND

In the related art, when test patterns for a target circuit designed in a design flow of a semiconductor integrated circuit are generated, the target circuit is divided into a plurality of circuits and the test patterns are generated in parallel with a plurality of computers in some cases in order to shorten a generation time of the test pattern.

For example, there is a known technology for dividing a target circuit so that the numbers of gates of circuits mapped to a plurality of field programmable gate arrays (FPGAs) are equal when the target circuit is mapped to the plurality of FPGAs (for example, see Japanese Laid-open Patent Publication No. 2000-207445).

In the related art, there is a known technology for supplying clock signals to storage elements of a scanning function unit in an opposite order to a data transmission direction when a plurality of clock domains are present in a target circuit and data transmission paths are not mixed between the clock domains (for example, see International Publication Pamphlet No. WO98/49576).

In technologies of the related art, however, when a plurality of blocks included in a target circuit are divided based on a circuit scale such as the number of gates, specific blocks are unevenly distributed to specific divided circuits. In this case, a problem may arise in that characteristics are unequal between the divided circuits.

An object of an embodiment is to provide a circuit division method for test pattern generation, a circuit division program for test pattern generation, and a circuit division device for test pattern generation, configured to equalize characteristics between divided circuits.

SUMMARY

According to an aspect of the invention, a circuit division method for test pattern generation is disclosed, in which a computer performs processes of: acquiring, for each of a plurality of blocks included in a target circuit for test pattern generation, a first feature amount regarding a size of each block based on circuit information indicating gates of the target circuit and a connection relation between the gates, and a second feature amount regarding a function of the block based on the circuit information; classifying the plurality of blocks into a plurality of groups so that blocks for which the acquired first feature amount is within a first predetermined range and the acquired second feature amount is within a second predetermined range belong to an identical group; and assigning, for each of the classified groups, each of the blocks included in the group to one of a plurality of divided circuits of a division number based on a ratio of the number of blocks included in the group to the division number by which the plurality of blocks are divided.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 15A and 15B are explanatory diagrams illustrating examples of a classification result and a distribution interval.

FIGS. 17A to 17C are explanatory diagrams illustrating block grouping examples.

FIG. 18 is an explanatory diagram illustrating a code example of a distribution interval decision method.

FIGS. 20A to 20D are explanatory diagrams illustrating block distribution examples.

FIG. 21 is a flowchart illustrating a procedure example of a circuit division list generation process performed by the test pattern generation device.

FIG. 22 is a flowchart illustrating detailed description of a block information sorting process (step S2102) illustrated in FIG. 21.

FIGS. 30A to 30C are explanatory diagrams illustrating a pattern reduction example by clock merging.

DESCRIPTION OF EMBODIMENT

An embodiment of a circuit division method for test pattern generation, a circuit division program for test pattern generation and a circuit division device for test pattern generation, applied to the present embodiment will be described in detail with reference to the following appended drawings.

Figure 1:
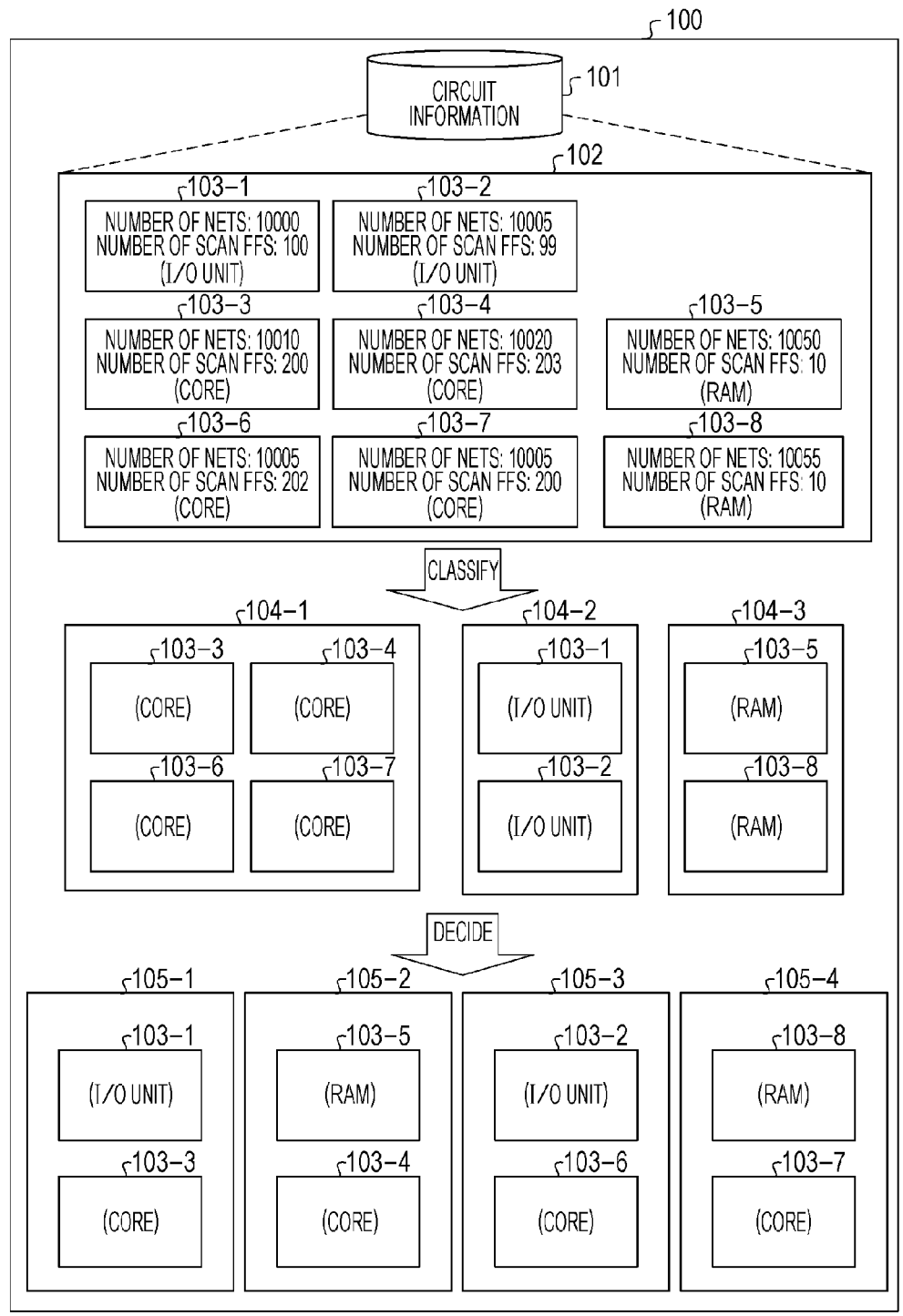
FIG. 1 is an explanatory diagram illustrating an operation example performed by a test pattern generation device applied to an embodiment.

FIG. 1 is an explanatory diagram illustrating an operation example performed by the test pattern generation device applied to the present embodiment. A test pattern generation device 100 is a computer that supports test pattern generation when a semiconductor integrated circuit is designed. A target circuit, a plurality of blocks, divided circuits, and the like according to the embodiment are not actual circuits, but are circuit models on a computer and circuits indicated by circuit information such as a netlist.

In the related art, a plurality of blocks included in a test pattern generation target circuit are divided and assigned to a plurality of computers and a simulation is performed through parallel processing in some cases. When loads of the computers are equal, a calculation time can be shortened. In recent years, the scales of input/output (I/O) units and random access memories (RAMs) are increased relative to the scales of central processing units (CPUs), and thus the scales thereof are substantially the same depending on cases. Therefore, when a plurality of blocks are divided in accordance with the number of gates, blocks with the same function or configuration are unevenly distributed to specific divided circuits in some cases, for example, in such a manner that only I/O units are assigned to a first divided circuit and only CPUs are assigned to a second divided circuit. Therefore, there is a problem that characteristics are unequal between the divided circuits.

For example, when the blocks with the same function or configuration are unevenly distributed to specific divided circuits, there is a possibility of a clock domain or the like being different between the divided circuits. Even in parallel processing performed on a plurality of divided circuits, operating circuit portions are also different when the characteristics of the clock domains of the blocks included in the divided circuits are different. Therefore, a processing time of a simulation or the like is also different between the divided circuits. Accordingly, efficiency of the entire parallel processing deteriorates due to end waiting of the divided circuit in which the processing is the slowest.

Accordingly, in the embodiment, the test pattern generation device 100 groups blocks based on closeness to feature amounts regarding scales and functions and assigns the blocks of the groups to the divided circuits based on a ratio of the number of blocks of the groups to the division number of divided circuits. Thus, it is possible to equalize the characteristics between the divided circuits.

First, for each of a plurality of blocks 103, the test pattern generation device 100 acquires a first feature amount regarding the size of the block 103 based on circuit information 101 and a second feature amount regarding the function of the block 103 based on the circuit information 101. The plurality of blocks 103 are included in a test pattern generation target circuit 102. The circuit information 101 indicates gates of the target circuit 102 and a connection relation between the gates. The circuit information 101 is, for example, a netlist. The circuit information is described by a verilog hardware description language (HDL) or a very high speed integrated circuit (VHSIC) HDL (VHDL) or is described at a gate level at which logics described by such a design language are developed to a circuit database for a specific CAD system.

The first feature amount is, for example, the number of nets. A sum number of the number of gates and the number of terminals of the gates is referred to as the number of nets. An input terminal of a gate is referred to as an input net and an output terminal of a gate is referred to as an output net or simply as a net. The second feature amount is, for example, the number of a predetermined type of gates. The predetermined type is, for example, the number of scan flip flops. The flip flop is also written as a flip flop (FF).

As an acquisition form, for example, the test pattern generation device 100 may acquire the first and second feature amounts by extracting the first and second feature amounts from the block 103 based on the circuit information 101. For example, the test pattern generation device 100 may acquire the first and second feature amounts by reading the first and second feature amounts from a storage device or may acquire the first and second feature amounts from another device via a network.

In the example of FIG. 1, blocks 103-1 to 103-8 are present in the target circuit 102. The blocks 103-1 and 103-2 are, for example, I/O units. The blocks 103-3, 103-4, 103-6, and 103-7 are cores. The blocks 103-5 and 103-8 are RAMs. In the block 103-1, for example, the number of nets is "10000" and the number of scan FFs is "100". The other blocks 103-2 to 103-8 have the numbers of nets and the numbers of scan FFs illustrated in FIG. 1.

Next, the test pattern generation device 100 classifies the plurality of blocks 103 into a plurality of groups 104 so that the blocks 103 for which the acquired first feature amount is within a first predetermined range and the acquired second feature amount is within a second predetermined range belong to the same group 104. The first and second predetermined ranges are decided in advance by a user such as a designer or a test pattern generation operant. In the example of FIG. 1, the blocks 103-3, 103-4, 103-6, and 103-7 are classified into the group 104-1. The blocks 103-1 and 103-2 are classified into the group 104-2. The blocks 103-5 and 103-8 are classified into the group 104-3.

The test pattern generation device 100 assigns each of the blocks 103 included in the groups 104 to one of a plurality of divided circuits 105 of a division number based on a ratio of the number of blocks 103 included in the group 104 to the division number in regard to each of the plurality of groups 104. The division number is a number by which the plurality of blocks 103 are divided. The division number is decided in advance by the user based on, for example, the number of computers capable of performing parallelization.

In the group 104-1, the number of blocks 103 is 4 and the division number is 4. Therefore, the test pattern generation device 100 assigns one of the blocks 103 included in the group 104-1 to each of the divided circuits 105. In the group 104-2, the number of blocks 103 is 2 and the division number is 4. Therefore, the test pattern generation device 100 assigns one of the blocks 103 to each of the divided circuits 105-1 and 105-3. In the group 104-3, the number of blocks 103 is 2 and the division number is 4. Therefore, the test pattern generation device 100 assigns one of the blocks 103 to each of the divided circuits 105-2 and 105-4 based on, for example, the number of nets.

In this way, the blocks 103 of which the functions or scales are close are grouped and the blocks 103 are assigned in accordance with the ratios of the number of blocks 103 included in the groups 104 to the division numbers. Thus, it is possible to equalize the characteristics between the divided circuits 105.

(Hardware Configuration Example of Test Pattern Generation Device 100)

Figure 2:
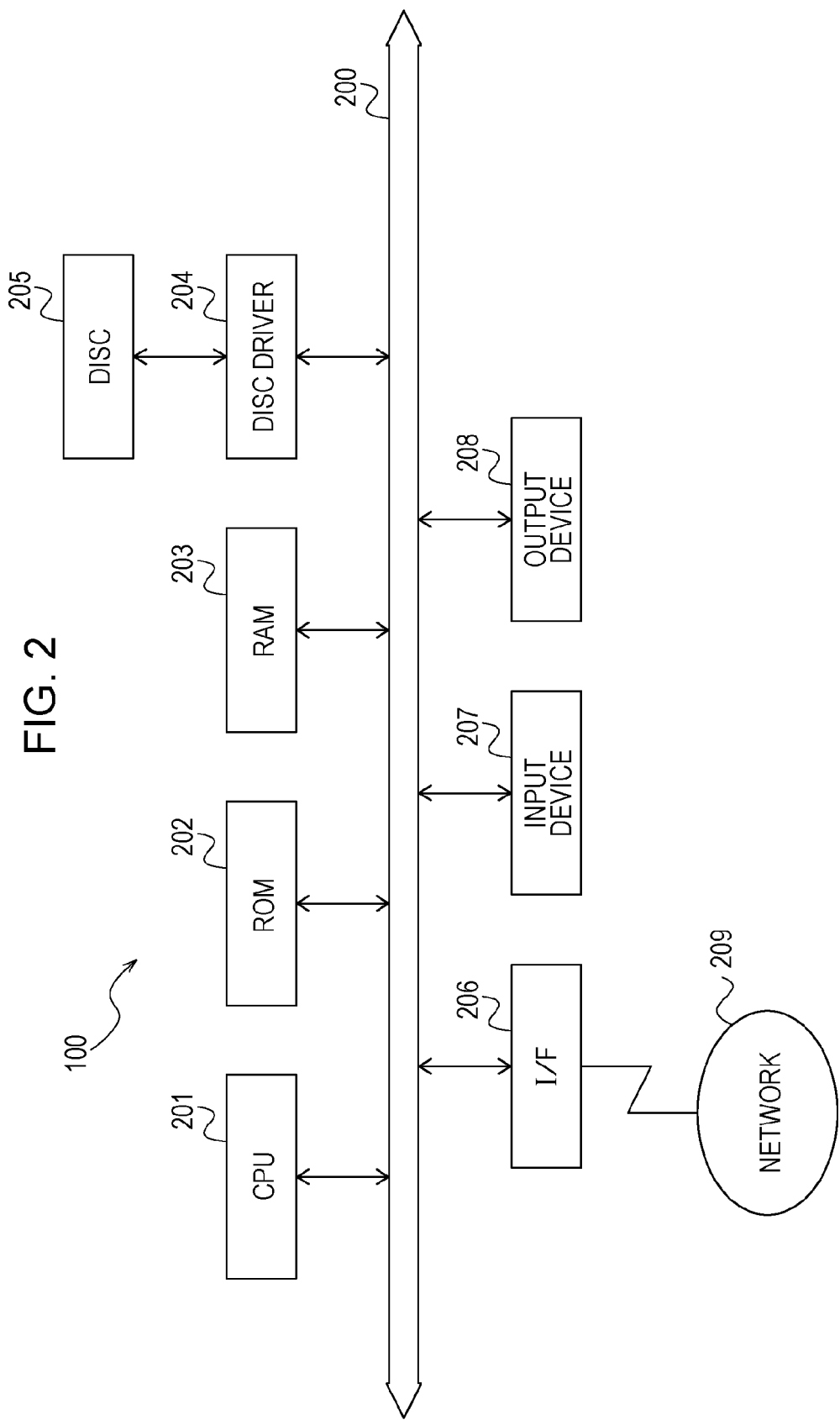
FIG. 2 is a block diagram illustrating a hardware configuration example of the test pattern generation device.

FIG. 2 is a block diagram illustrating a hardware configuration example of the test pattern generation device. In FIG. 2, the test pattern generation device 100 includes a CPU 201, a read-only memory (ROM) 202, a RAM 203, a disc driver 204, and a disc 205. The test pattern generation device 100 includes an inter/face (I/F) 206, an input device 207, and an output device 208. The units are connected by a bus 200.

Here, the CPU 201 serves to control the entire test pattern generation device 100. The ROM 202 stores a program such as a boot program. The RAM 203 is used as a work area of the CPU 201. The disc driver 204 controls read/write of data from and on the disc 205 under the control of the CPU 201. The disc 205 stores data written under the control of the disc driver 204. Examples of the disc 205 include a magnetic disk and an optical disc.

The I/F 206 is connected to a network 209 such as a local area network (LAN), a wide area network (WAN), or the Internet and is connected via a communication line to another device via the network 209. The I/F 206 serves as an internal interface with the network 209 and controls input and output of data from an external device. The I/F 206 can adopt, for example, a modem or a LAN adapter.

The input device 207 is an interface that inputs various kinds of data through a manipulation of a user on a keyboard, a mouse, a touch panel, or the like. The input device 207 can capture an image or a moving image from a camera. The input device 207 can capture a sound from a microphone. The output device 208 is an interface that outputs data in accordance with an instruction of the CPU 201. Examples of the output device 208 include a display and a printer.

(Functional Configuration Example of Test Pattern Generation Device 100)

Figure 3:
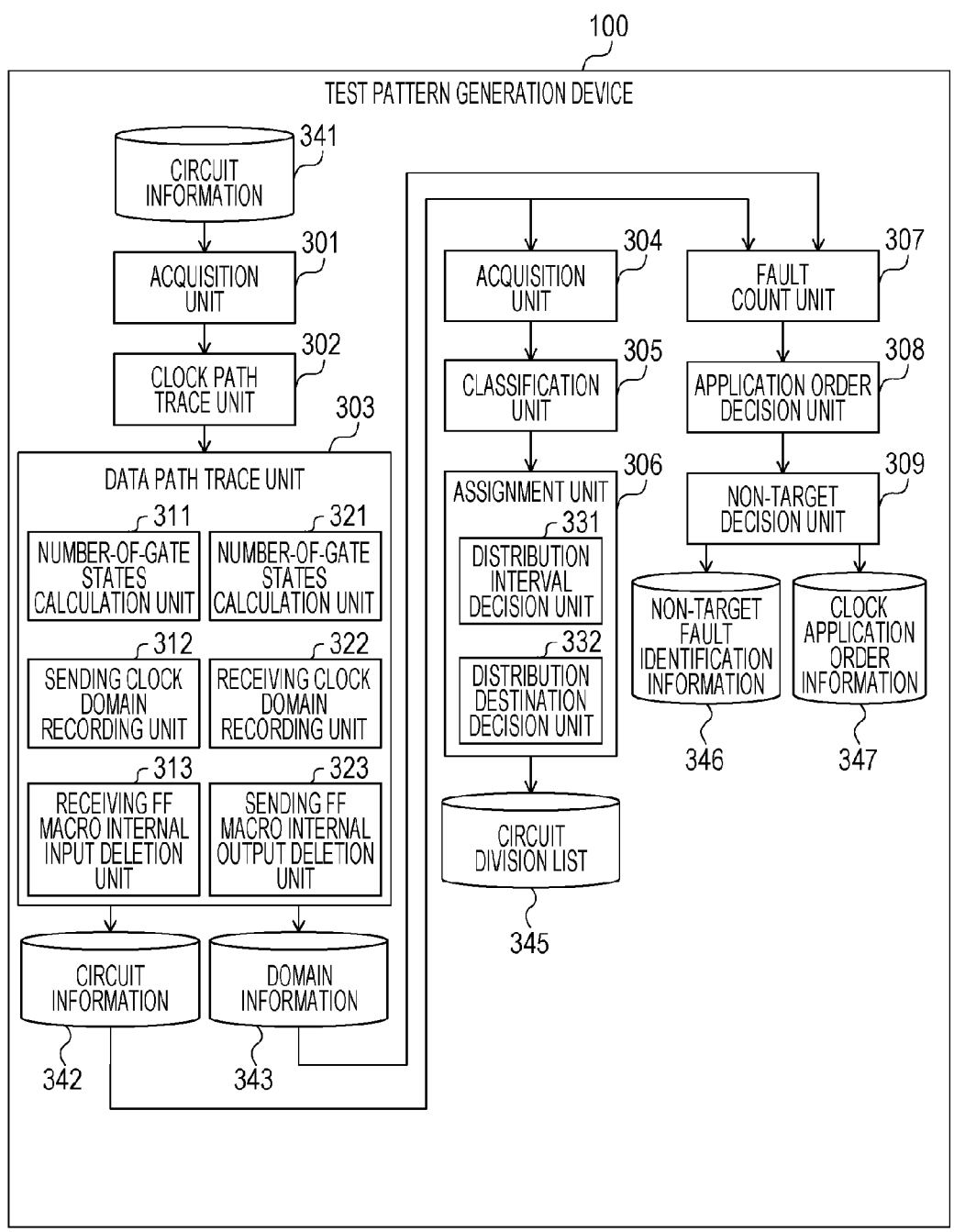
FIG. 3 is a block diagram illustrating a functional configuration example of the test pattern generation device.

FIG. 3 is a block diagram illustrating a functional configuration example of the test pattern generation device. The test pattern generation device 100 includes an acquisition unit 301, a clock path trace unit 302, a data path trace unit 303, an acquisition unit 304, a classification unit 305, an assignment unit 306, a fault count unit 307, an application order decision unit 308, a non-target decision unit 309. For example, processes of a control unit from the acquisition unit 301 to the non-target decision unit 309 are coded in a program stored in a storage device such as the ROM 202, the RAM 203, or the disc 205 which can be accessed by the CPU 201 illustrated in FIG. 2. Then, the CPU 201 reads the program from the storage device and performs the processes coded in the program. Thus, the processes of the control unit are realized. For example, processing results of the control unit are stored in a storage device such as the ROM 202, the RAM 203, or the disc 205.

Each control unit will be described by separating processes into three processes, redundant delay gate deletion, block division, and clock merging. In technologies of the related art, when a target circuit is modeled at a gate level, a redundant gate is inserted at a component level called a macro in some cases in order to avoid a race in a unit delay scheme. In these cases, extra delay gates are inserted even into paths in which there is originally no race, and thus a problem may arise in that circuit models are enlarged. Accordingly, in the embodiment, the control unit performs a redundant delay gate deletion process. In technologies of the related art, when a plurality of blocks included in a target circuit are divided based on the scales of the circuits such as the number of gates in order to generate test patterns, specific blocks are unevenly distributed to specific divided circuits. a problem may arise in that characteristics are unequal between the divided circuits. Accordingly, in the embodiment, the control unit performs a block division process. In technologies of the related art, even when a plurality of clocks are present, the number of clocks to be applied after scanning is restricted to one in some cases. In the cases, the scanning and the clock application may be performed again on a circuit which is not tested, and thus a problem may arise in that test patterns are increased. Accordingly, in the embodiment, the control unit performs a clock merging process.

<Redundant Delay Gate Deletion>

First, an example of redundant delay gate deletion will be described. In the related art, when a circuit model is created with a gate model, the circuit model is increased due to a generation method in some cases. When a test pattern is generated, a gate model is used as a circuit model and a unit delay scheme is used as a simulation scheme in some cases. A race occurring in the gate model should be resolved.

As a method of resolving a race in the gate model, for example, insertion of a delay gate into a data path in which a race occurs, insertion of a delay gate into a clock path of a sending FF, deletion of a delay gate of a clock path of a receiving FF can be exemplified. When a clock path is corrected, there is an influence on other paths. Therefore, it is easy to realize the resolving method of inserting one or more delay gates into a data path.

The design of a circuit model is performed by assembling a component called a macro. Accordingly, there is considered nonoccurrence of a race when delay gates are inserted into a macro used in a data line and a circuit model is assembled. In particular, delay gates are inserted inside an FF macro serving as a starting point of a data path or an ending point of a data path in some cases.

However, in a data path in which no race originally occurs, an extra delay gate is inserted. In particular, separation between delay in an actual circuit and delay indicated simply by the number of gate stages as in a unit delay scheme increases due to, for example, an increase in line delay caused due to minuteness or skew adjustment in a recent fast processor. For this reason, a problem may arise in that the scale (the total number of gates) of a circuit model increases due to insertion of delay gates for resolving a race in a gate model. In the unit delay scheme, it takes a more simulation time of a logic simulation as the number of gates included in a circuit model is larger.

Accordingly, in the embodiment, redundant delay is deleted from an FF macro for which it is determined that no race occurs based on the number of gate stages. Thus, the enlargement of a circuit model is suppressed.

First, the acquisition unit 301 acquires first circuit information indicating gates of a test pattern generation target circuit and a connection relation between the gates. The first circuit information is a netlist described at a gate level. The first circuit information is, for example, circuit information 341.

Next, the clock path trace unit 302 specifies the number of gates on a clock path from a clock terminal which supplies a clock signal to an FF included in a block to the FF. A number-of-gate stages calculation unit 311 present in the data path trace unit 303 specifies the number of gates on a data path from an FF to an FF present in a forward direction. A receiving FF macro internal input deletion unit 313 specifies a difference value between the specified number of gates and the number of gates specified by the clock path trace unit 302. The FF is an FF that is included in a block inside the target circuit indicated by the first circuit information, and the FF macro which is a part of an FF macro includes a plurality of redundant delay gates inserted into a data input side and a data output side which can serve as a data path in the macro for a countermeasure against the race. The data input side is, for example, a D terminal included in the FF and the data output side is, for example, a Q terminal included in the FF. The receiving FF macro internal input deletion unit 313 generates second circuit information indicating gates and a connection relation between the gates of a target circuit which includes an FF macro from which redundant delay gates inside a receiving FF macro are deleted based on the difference value. Here, the second circuit information is, for example, circuit information 342.

Similarly, the clock path trace unit 302 specifies the number of gates on the clock path from the clock terminal which supplies a clock signal to the FF included in the block to the FF. A number-of-gate stages calculation unit 321 present in the data path trace unit 303 specifies the number of gates on a data path from the FF to an FF present in a backward direction. A sending FF macro internal output deletion unit 323 specifies a difference value between the specified number of gates and the number of gates specified by the clock path trace unit 302. The FF is an FF that is included in a block inside the target circuit indicated by the first circuit information, and the FF macro which is a part of the FF macro includes a plurality of redundant delay gates inserted into the data input side and the data output side which can serve as the data path in the macro for a countermeasure against the race. The data input side is, for example, a D terminal included in the FF and the data output side is, for example, a Q terminal included in the FF. A sending FF macro internal output deletion unit 323 generates the second circuit information indicating gates and a connection relation between the gates of a target circuit which includes an FF macro from which redundant delay gates inside a sending FF macro are deleted based on the difference value. Here, the second circuit information is, for example, circuit information 342.

The clock path trace unit 302 specifies, for example, a Max of the number of gate stages and a Min of the number of gate stages for each clock path by tournament calculation in regard to each clock domain which is a range on which a clock signal of interest has a direct influence. The data path trace unit 303 performs forward trace of the data path from the FF macro at which a trace arrives. Alternatively, the data path trace unit 303 performs backward trace of the data path from the FF macro at which the trace arrives. Here, the data path trace unit 303 performs a process of deleting a redundant gate on the input side inside the receiving FF macro in which the forward trace is performed and a process of deleting a redundant gate on the output side inside the sending FF macro in which perform the backward trace is performed.

Therefore, the data path trace unit 303 includes the number-of-gate stages calculation unit 311, a sending clock domain recording unit 312, a receiving FF macro internal input deletion unit 313 for the process of deleting a redundant gate on the input side inside the receiving FF macro. The data path trace unit 303 includes the number-of-gate stages calculation unit 321, a receiving clock domain recording unit 322, a sending FF macro internal output deletion unit 323 for the process of deleting a redundant gate on the output side inside the sending FF macro in which perform the backward trace is performed.

First, the details of the process of deleting a redundant gate on the input side inside the receiving FF macro will be described.

Figure 4:
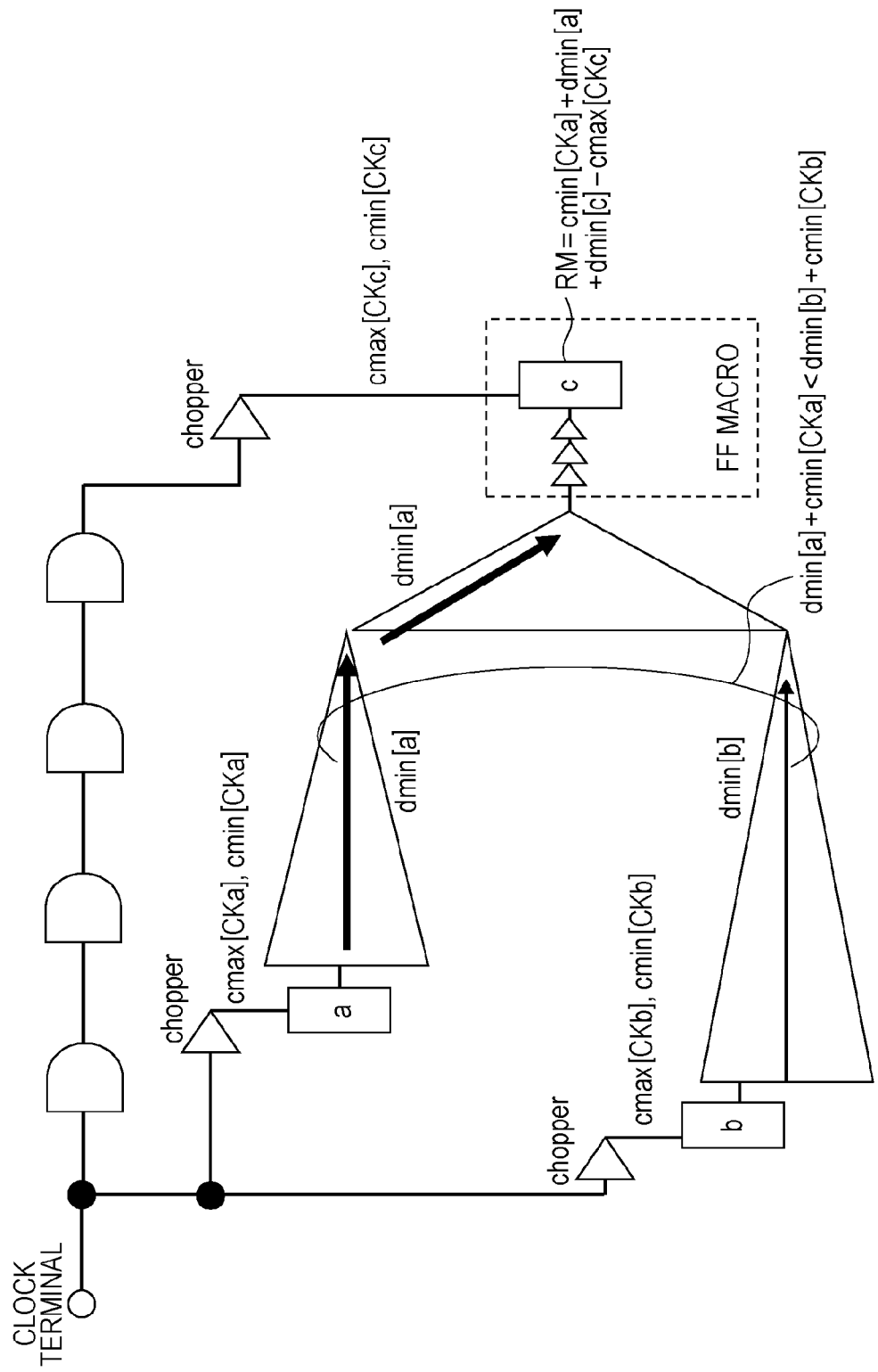
FIG. 4 is an explanatory diagram illustrating a deletion example of a redundant gate on an input side inside a receiving FF macro.

FIG. 4 is an explanatory diagram illustrating a deletion example of a redundant gate on the input side inside the receiving FF macro. For example, in a selected FF macro included in a block, the clock path trace unit 302 specifies a Max of the number of gate stages and a Min of the number of gate stages on the clock path from a clock terminal included in the block to a clock terminal of the FF macro.

Figure 7:
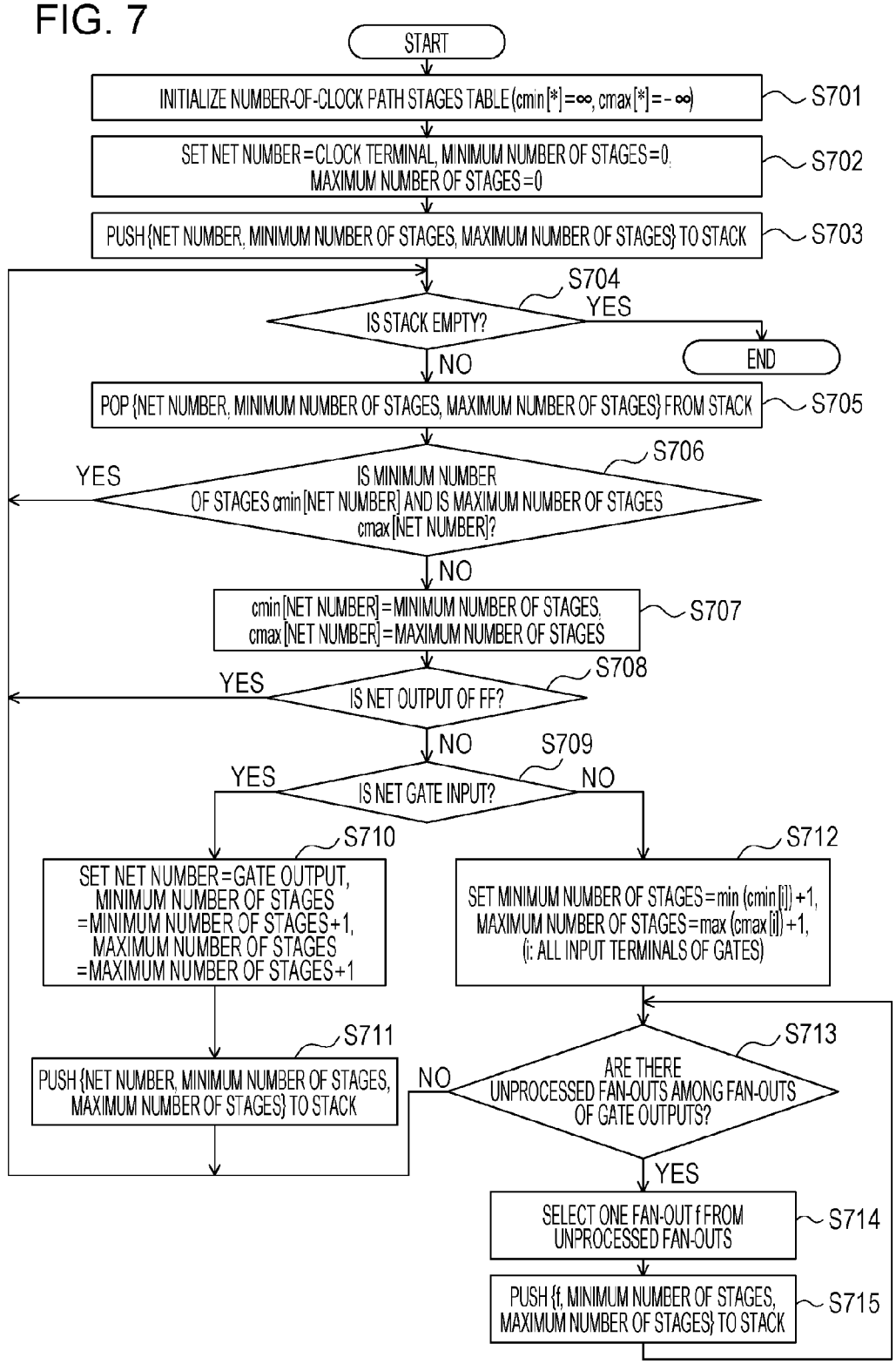
FIG. 7 is a flowchart illustrating detailed description of a trace process of a clock path (step S604) illustrated in FIG. 6.

For example, a Max in an FF macro a is cmax[CKa] and a Min in the FF macro a is cmin[CKa]. For example, a Max in an FF macro b is cmax[CKb] and a Min in the FF macro b is cmin[CKb]. For example, a Max in an FF macro c is cmax[CKc] and a Min in the FF macro c is cmin[CKc]. A detailed example of a clock path trace process performed by the clock path trace unit 302 is illustrated in FIG. 7.

The clock path trace unit 302 calculates the number of gate stages using the clock terminal included in the block as a starting point and using the clock terminal of the FF macro included in the block as an ending point. For example, the clock path trace unit 302 prepares a table for the clock path of cmin and cmax. When an output terminal of a current gate is "o" and an input terminal of the current gate is "i", the clock path trace unit 302 updates cmin and cmax while performing tournament of the Min and the Max as follows:

$$cmin[o]=min(cmin[i])+1,$$

$$cmax[o]=max(cmax[i])+1,$$

(where there are N inputs, $i=i1, i2, i3, \ldots, iN$).

Further, when the clock path is branched or merged in each of cmax and cmin, the clock path trace unit 302 decides the ranges of the Min and the Max of the number of passed gate stages.

The clock path trace unit 302 may specify the number of gate stages of the clock path in regard to the selected FF macro or may perform trace sequentially from the clock terminal included in the block to all of the FF macros at which the trace arrives.

The data path trace unit 303 performs the forward trace of the data path from the FF macro at which the trace arrives. As described above, the data path trace unit 303 includes the number-of-gate stages calculation unit 311, the sending clock domain recording unit 312, and the receiving FF macro internal input deletion unit 313.

Specifically, for example, the number-of-gate stages calculation unit 311 calculates the Min of the number of gate stages of each data path by performing the trace process of the data path. For example, the number-of-gate stages calculation unit 311 performs the forward trace using the FF at which a clock trace arrives as a starting point and using an input of an FF of the subsequent stage as an ending point.

The number-of-gate stages calculation unit 311 prepares a table dmin [ ] having the same number of elements as the netlist for the data path. The number of elements of the netlist is, for example, a sum of the number of gates belonging to the net and the number of input and output terminals of each gate. The number-of-gate stages calculation unit 311 sets an initial value of the number of trace stages as the number of stages cmin[CK] of the clock terminal of each FF. When a gate output terminal of a current trace is "o" and a gate input terminal is "i", the number-of-gate stages calculation unit 311 updates dmin while performing minimum tournament as follows:

$$d\min[o]=\min(d\min[i])+1.$$

In the forward trace, the number-of-gate stages calculation unit 311 decides the Min of the number of passed gate stages when a path is branched or merged as dmin.

Figure 9:
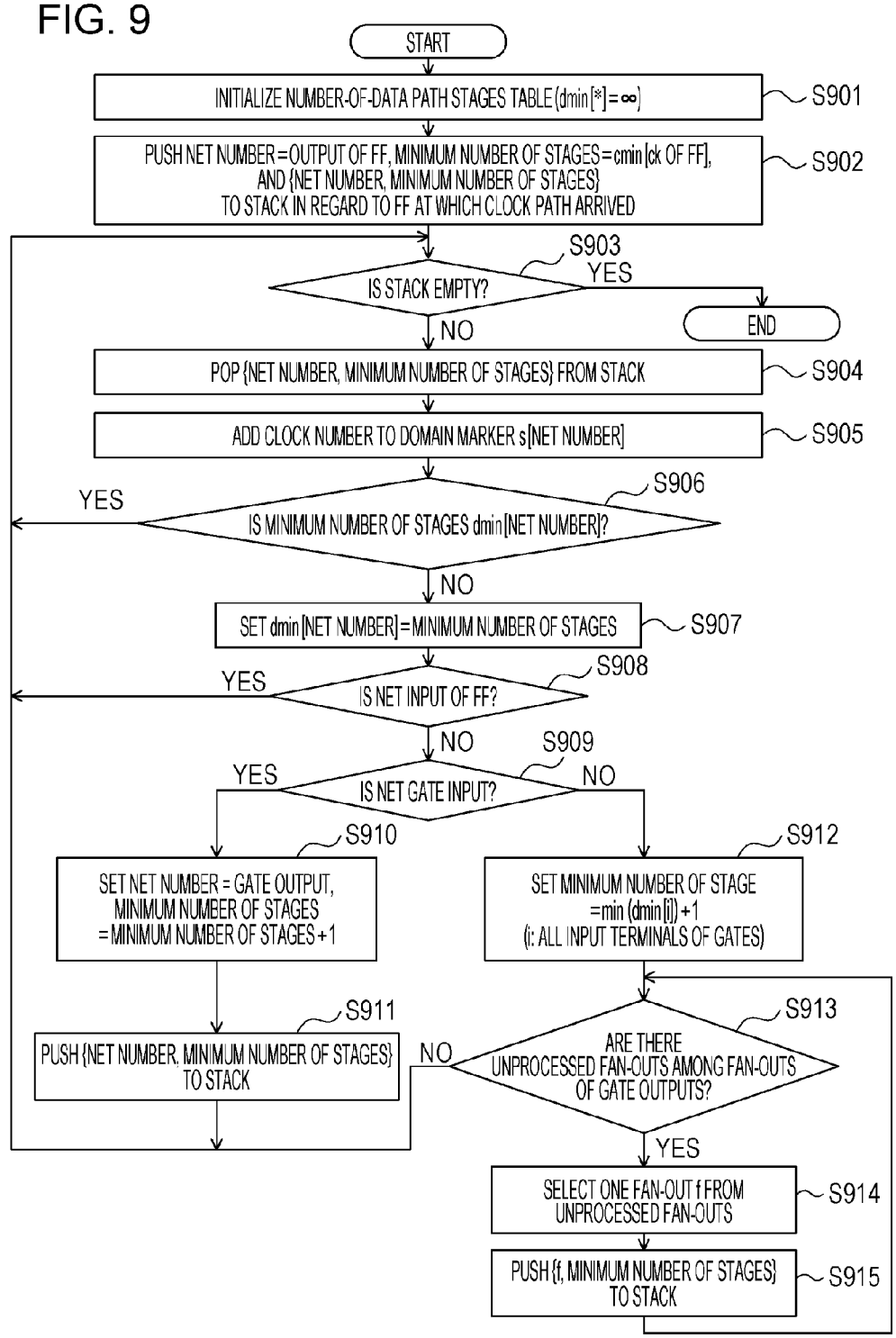
FIG. 9 is a flowchart illustrating detailed description of a forward process of a data path (step S605) illustrated in FIG. 6.

The sending clock domain recording unit 312 records identification information of a clock supplied to a targeting FF. For example, the sending clock domain recording unit 312 records a target clock number in a domain marker s [net number of FF output]. Here, detailed examples of processes of the number-of-gate stages calculation unit 311 and the sending clock domain recording unit 312 are illustrated in FIG. 9.

The receiving FF macro internal input deletion unit 313 calculates a race margin in regard to clock terminals and data input terminals of all of the FFs at which the trace of the clock path arrives after the trace ends. The race margin can be calculated by formula (1) below. In formula (1) below, D indicates a data input terminal and CK indicates a clock terminal.

$$\text{race margin}=d\min[D]-c\max[CK] \quad (1)$$

The race margin is a difference value between the Min of the number of gate stages in the data path and the Max of the number of data stages in the clock path. Therefore, when the race margin is a positive value, the race margin indicates that there is no race. The receiving FF macro internal input deletion unit 313 deletes delay gates inserted into the data input terminal of the FF macro using the number of stages equal to or less than the race margin as a Max.

In the example of FIG. 4, when a deletion target delay gate is FF macro c, there are dmin[a]+cmin[CKa] and dmin[b]+cmin[CKb] as the number of gate stages in the data path. Since dmin[a]+cmin[CKa] is smaller, the receiving FF macro internal input deletion unit 313 selects dmin[a]+cmin[CKa] as a Min. Further, the Max of the number of gate stages in the clock path is cmax[CKc]. Therefore, a race margin RM in regard to the FF macro c is derived by "cmin[CKa]+dmin[a]+dmin[c]−cmax[CKc]".

Next, a process of deleting a redundant gate on the output side inside the sending FF macro in which the backward trace is performed will be described.

Figure 5:
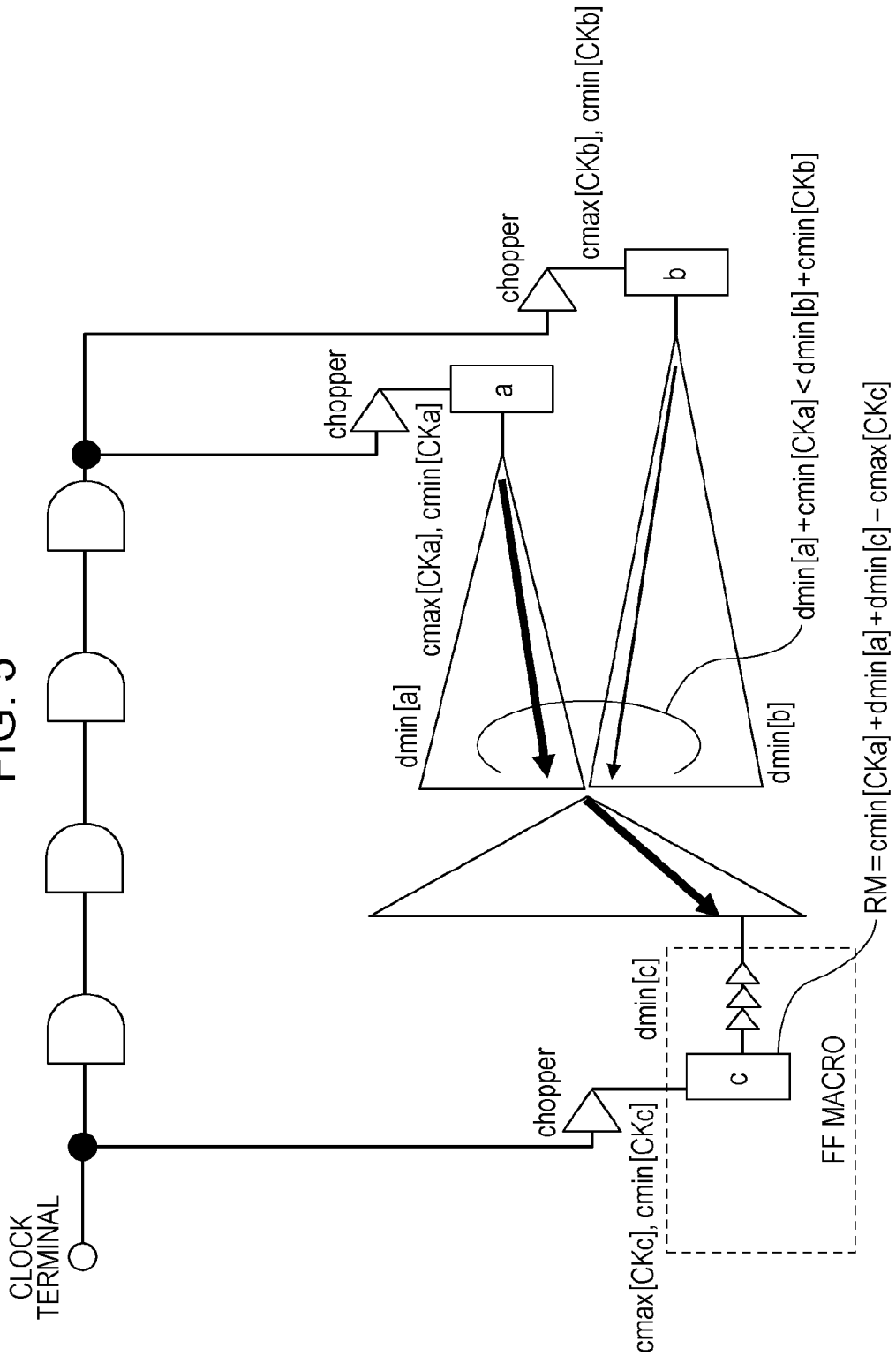
FIG. 5 is an explanatory diagram illustrating a deletion example of a delay gate on an output side inside a sending FF macro.

FIG. 5 is an explanatory diagram illustrating a deletion example of a delay gate on an output side inside the sending FF macro. For example, in a selected FF macro included in a block, the clock path trace unit 302 specifies the Max of the number of gate stages and the Min of the number of gates on the clock path from a clock terminal included in the block to a clock terminal of the FF macro.

For example, a Max in an FF macro a is cmax[CKa] and a Min in the FF macro a is cmin[CKa]. For example, a Max in an FF macro b is cmax[CKb] and a Min in the FF macro b is cmin[CKb]. For example, a Max in an FF macro c is cmax[CKc] and a Min in the FF macro c is cmin[CKc]. A detailed example of a clock path trace process performed by the clock path trace unit 302 is illustrated in FIG. 7.

For example, the number-of-gate stages calculation unit 321 prepares a table dmin [ ] having the same number of elements as the netlist for the data path. The number-of-gate stages calculation unit 321 performs backward trace using a data input terminal of an FF at which a clock trace arrives as a starting point and using a data output terminal of an FF at the previous stage as an ending point. The number-of-gate stages calculation unit 321 sets an initial value of the number of trace stages as the clock terminal and the data input terminal of the FF. When a gate output terminal of a trace is "o" and an input terminal of a fan-out destination is "i", dmin is updated while performing minimum tournament as follows:

$$d\min[o]=\min(d\min[i])+1.$$

In the backward trace, the number-of-gate stages calculation unit 321 decides the Min of the number of passed gate stages when a path is branched or merged as dmin.

Figure 10:
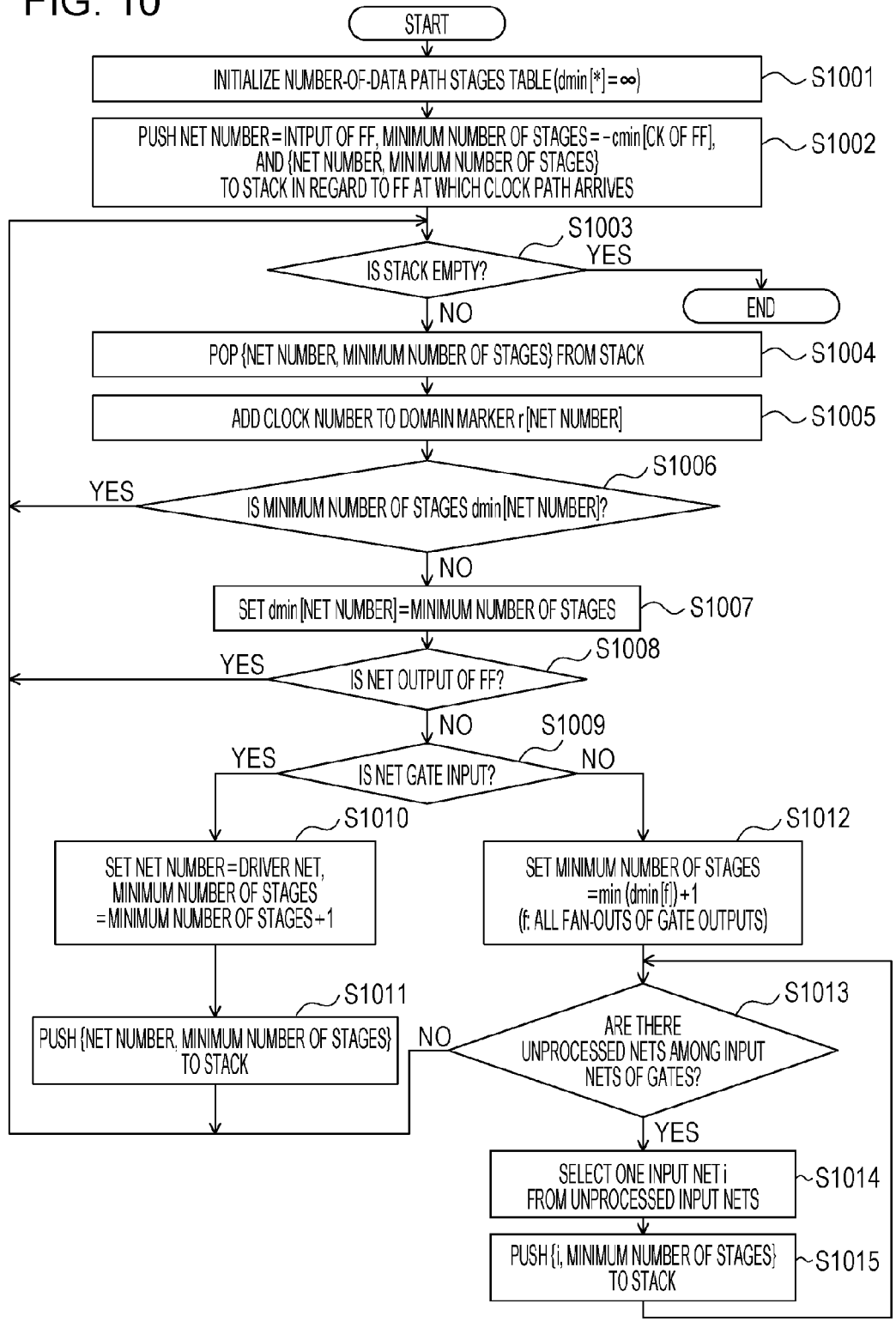
FIG. 10 is a flowchart illustrating detailed description of a backward process of the data path (step S607) illustrated in FIG. 6.

The receiving clock domain recording unit 322 records identification information of a clock supplied to a targeting FF. For example, the receiving clock domain recording unit 322 records a target clock number in a domain marker r [net number of FF output]. Here, detailed examples of processes of the number-of-gate stages calculation unit 321 and the receiving clock domain recording unit 322 are illustrated in FIG. 10.

The sending FF macro internal output deletion unit 323 calculates a race margin in regard to clock terminals and data output terminals of all of the FFs at which the trace of the clock path arrives after the trace ends. The race margin can be calculated by formula (2) below. In formula (2) below, Q indicates a data output terminal and CK indicates a clock terminal.

$$\text{race margin}=d\min[Q]-c\max[CK] \quad (2)$$

The race margin is a difference value between the Min of the number of gate stages in the data path and the Max of the number of data stages in the clock path. Therefore, when the race margin is a positive value, the race margin indicates that there is no race. The sending FF macro internal output deletion unit 323 deletes delay gates inserted into the data input terminal of the FF macro using the number of stages equal to or less than the race margin as a Max.

In the example of FIG. 5, when a deletion target delay gate is FF macro c, there are dmin[a]+cmin[CKa] and dmin[b]+cmin[Ckb] as the number of gate stages in the data path. Since dmin[a]+cmin[CKa] is smaller, the sending FF macro internal output deletion unit 323 selects dmin[a]+cmin[CKa]

as a Min. Further, the Max of the number of gate stages in the clock path is cmax[CKc]. Therefore, a race margin RM in regard to the FF macro c is derived by "cmin[CKa]+dmin[a]+dmin[c]−cmax[CKc]".

(Procedure Example of Redundant Delay Gate Deletion Process by Test Pattern Generation Device 100)

Figure 6:
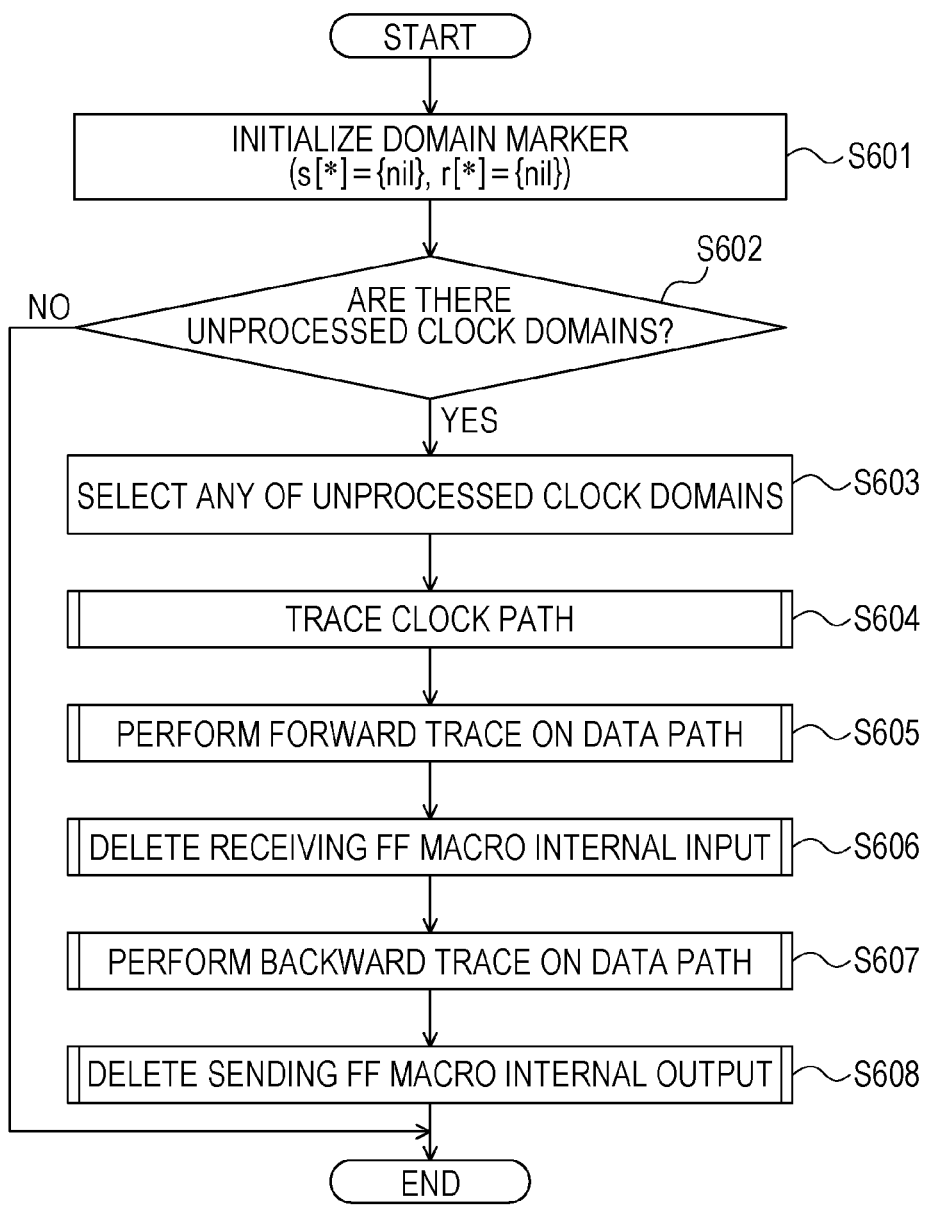
FIG. 6 is a flowchart illustrating a procedure example of a redundant delay gate deletion process performed by the test pattern generation device.

FIG. 6 is a flowchart illustrating a procedure example of a redundant delay gate deletion process performed by the test pattern generation device. The test pattern generation device 100 initializes a domain marker (step S601). For example, the test pattern generation device 100 sets s[*]={nil} and r[*]={nil}.

Next, the test pattern generation device 100 determines whether there are unprocessed clock domains (step S602). When the test pattern generation device 100 determines that there are unprocessed clock domains (Yes in step S602), the test pattern generation device 100 selects any of the unprocessed clock domains as a processing target (step S603). The test pattern generation device 100 traces the clock path (step S604).

The test pattern generation device 100 performs the forward trace on the data path (step S605). Next, the test pattern generation device 100 performs deletion of a receiving FF macro internal input (step S606). Then, the test pattern generation device 100 performs backward trace on the data path (step S607). Subsequently, the test pattern generation device 100 performs deletion of a sending FF macro internal output (step S608) and ends the series of processes.

When the test pattern generation device 100 determines in step S602 that there is no unprocessed clock domain (No in step S602), the test pattern generation device 100 ends the series of processes.

FIG. 7 is a flowchart illustrating detailed description of the trace process of the clock path (step S604) illustrated in FIG. 6. First, the test pattern generation device 100 initializes a number-of-clock path stages table (step S701). In step S701, for example, the test pattern generation device 100 sets "cmin[*]=∞" and "cmax[*]=−∞". Next, the test pattern generation device 100 sets "net number=clock terminal", "minimum number of stages=0", and "maximum number of stages=0" (step S702). The test pattern generation device 100 pushes {net number, minimum number of stages, maximum number of stages} to a stack (step S703).

The test pattern generation device 100 determines whether the stack is empty (step S704). When the test pattern generation device 100 determines that the stack is not empty (No in step S704), the test pattern generation device 100 pops {net number, minimum number of stages, maximum number of stages} from the stack (step S705). The test pattern generation device 100 determines whether the minimum number of stages is cmin[net number] and the maximum number of stages is cmax[net number] (step S706).

When the test pattern generation device 100 determines that the minimum number of stages is cmin[net number] and the maximum number of stages is cmax[net number] (Yes in step S706), the test pattern generation device 100 returns the process to step S704. When the test pattern generation device 100 determines that the minimum number of stages is not cmin[net number] and the maximum number of stages is not cmax[net number] (No in step S706), the test pattern generation device 100 sets "cmin[net number]=minimum number of stages" and "cmax[net number]=maximum number of stages" (step S707).

Next, the test pattern generation device 100 determines whether the net is an output of the FF (step S708). When the test pattern generation device 100 determines that the net is the output of the FF (Yes in step S708), the test pattern generation device 100 returns the process to step S704. When the test pattern generation device 100 determines that the net is not the output of the FF (No in step S708), the test pattern generation device 100 determines whether the net is a gate input (step S709). The gate input is an input terminal of the gate. Determining whether the net is the gate input is determining whether the net is an input net.

When the test pattern generation device 100 determines that the net is the gate input (Yes in step S709), the test pattern generation device 100 sets "net number=gate output", "minimum number of stages=minimum number of stages+1", and "maximum number of stages=maximum number of stages+1" (step S710). The test pattern generation device 100 pushes {net number, minimum number of stages, maximum number of stages} to the stack (step S711) and returns the process to step S704. Conversely, when the test pattern generation device 100 determines that the net is not the gate input (No in step S709), the test pattern generation device 100 sets "minimum number of stages=min (cmin[i])+1" and "maximum number of stages=max (cmax[i])+1" (step S712). In step S712, i indicates all of the input terminals of gates.

The test pattern generation device 100 determines whether there are unprocessed fan-out among the fan-outs of the gate outputs (step S713). When the test pattern generation device 100 determines that there are the unprocessed fan-outs among the fan-outs the gate outputs (Yes in step S713), the test pattern generation device 100 selects one fan-out f from the unprocessed fan-outs (step S714). Then, the test pattern generation device 100 pushes {f, minimum number of stages, maximum number of stages} to the stack (step S715) and returns the process to step S713.

When the test pattern generation device 100 there is no unprocessed fan-out among the fan-outs of the gate output (No in step S713), the test pattern generation device 100 returns the process to step S704. Conversely, when the test pattern generation device 100 determines in step S704 that the stack is empty (Yes in step S704), the test pattern generation device 100 ends the series of processes.

Figure 8:
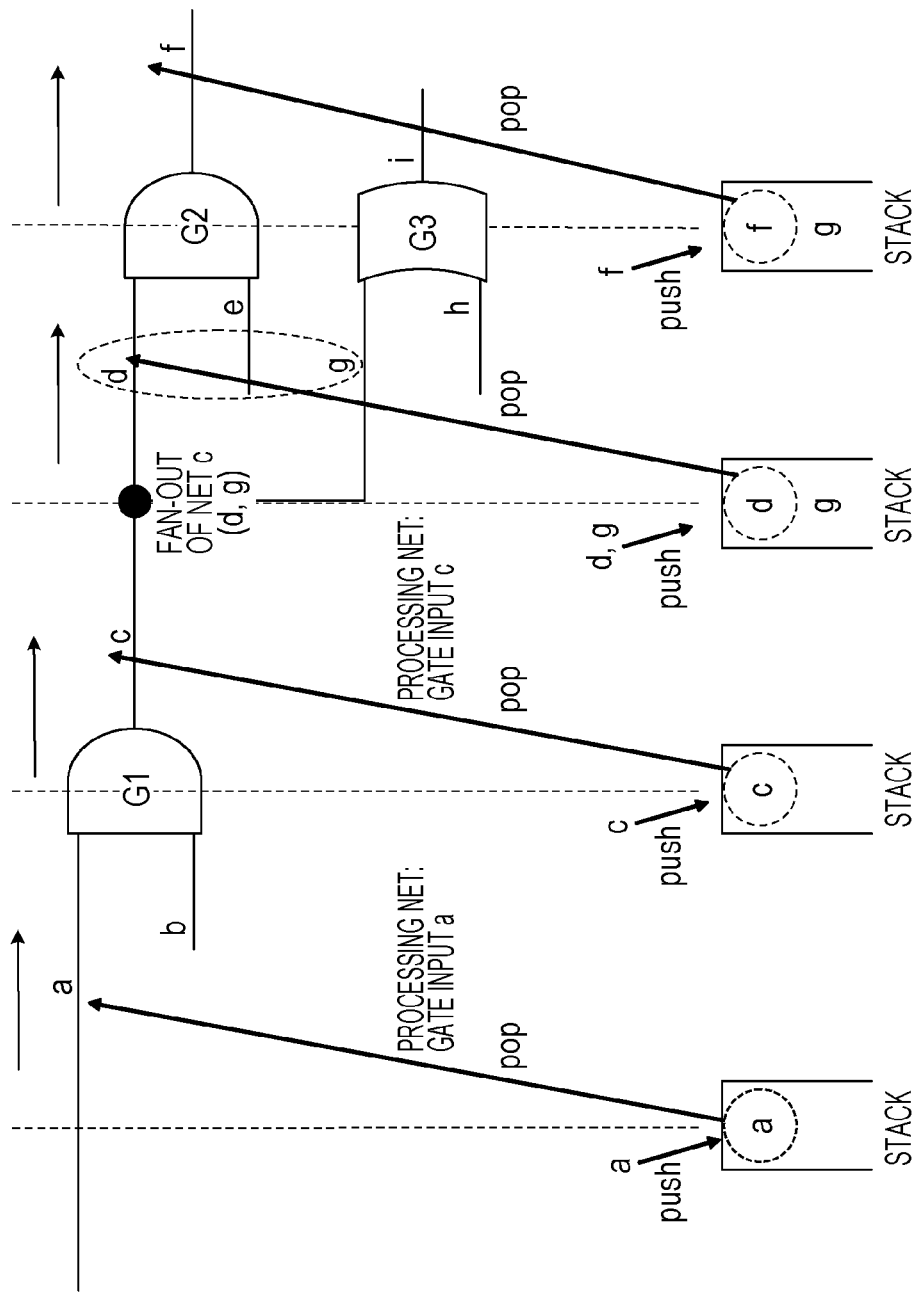
FIG. 8 is an explanatory diagram illustrating a forward trace example of nets on the clock path.

FIG. 8 is an explanatory diagram illustrating a forward trace example of nets on the clock path. In FIG. 8, G1, G2, and G3 present on the clock path are illustrated as examples. For example, in FIG. 8, a form of the forward trace performed in the order of nets a→c→d→f is illustrated. First, as a start state, the net a is pushed to the stack.

Next, the test pattern generation device 100 sets the net a as a processing target net by popping the net a from the stack. The net a is an input net of a 2-input AND gate G1. Therefore, the test pattern generation device 100 sets the net c of the output of the gate G1 as a net number and pushes the net c to the stack. Then, the test pattern generation device 100 adds 1 to the minimum number of stages and the maximum number of stages and pushes the minimum number of stages and the maximum number of stages to the stack.

Next, the test pattern generation device 100 sets the net c as a processing target net by popping the net c from the stack. The net c is an output net of the 2-input AND gate G1. Therefore, the test pattern generation device 100 pushes an input net d of a gate G2 and an input net g of a gate G3 which are fan-out destinations of the net c to the stack. The test pattern generation device 100 refers to all of the input terminals a and b of the gate G1. Then, the test pattern generation device 100 calculates the minimum number of stages and the maximum number of stages and pushes the minimum number of stages and the maximum number of stages to the stack.

Next, the test pattern generation device 100 sets the net d as a processing target net by popping the net d from the stack. The test pattern generation device 100 performs the same process as the process performed on the net a on the net d.

Next, the test pattern generation device 100 sets a net g as a processing target net by popping the net g from the stack. The test pattern generation device 100 performs the same process as the process performed on the net a on the net g. The forward trace is performed in this way.

FIG. 9 is a flowchart illustrating detailed description of the forward process of the data path (step S605) illustrated in FIG. 6. The test pattern generation device 100 initializes a number-of-data path stages table (step S901). In step S901, for example, the test pattern generation device 100 sets "dmin[*]=∞".

The test pattern generation device 100 pushes "net number=output of FF", "minimum number of stages=cmin [ck of FF]", and {net number, minimum number of stages} to the stack in regard to the FF at which the clock path arrived (step S902). Then, the test pattern generation device 100 determines whether the stack is empty (step S903). When the test pattern generation device 100 determines that the stack is empty (No in step S903), the test pattern generation device 100 pops {net number, minimum number of stages} from the stack (step S904).

The test pattern generation device 100 adds a clock number to the domain marker s [net number] (step S905). The test pattern generation device 100 determines whether the minimum number of stages is dmin [net number] (step S906). When the test pattern generation device 100 determines that the minimum number of stages is dmin [net number] (Yes in step S906), the test pattern generation device 100 returns the process to step S903. When the test pattern generation device 100 determines that the minimum number of stages is not dmin [net number] (No in step S906), the test pattern generation device 100 sets "dmin= [net number]=minimum number of stages" (step S907).

The test pattern generation device 100 determines whether the net is an input of the FF (step S908). When the test pattern generation device 100 determines that the net is the input of the FF (Yes in step S908), the test pattern generation device 100 returns the process to step S903. When the test pattern generation device 100 determines that the net is not the input of the FF (No in step S908), the test pattern generation device 100 determines whether the net is a gate input (step S909). When the test pattern generation device 100 determines that the net is the gate input (Yes in step S909), the test pattern generation device 100 sets "net number=gate output", "minimum number of stages= minimum number of stages+1" (step S910). The test pattern generation device 100 pushes {net number, minimum number of stages} to the stack (step S911) and returns the process to step S903.

Conversely, when the test pattern generation device 100 determines that the net is not the gate input (No in step S909), the test pattern generation device 100 sets {minimum number of stages=min (dmin[i])+1" (step S912). In step S912, i indicates all of the input terminals of gates. Next, the test pattern generation device 100 determines whether there are unprocessed fan-outs among the fan-outs of the gate outputs (step S913).

When the test pattern generation device 100 determines that there is no unprocessed fan-out among the fan-outs of the gate outputs (No in step S913), the test pattern generation device 100 returns the process to step S903. When the test pattern generation device 100 determines that there are the unprocessed fan-outs among the fan-outs of the gate outputs (Yes in step S913), the test pattern generation device 100 selects one fan-out f from the unprocessed fan-outs (step S914). Then, the test pattern generation device 100 pushes {f, minimum number of stages} to the stack (step S915) and returns the process to step S913.

When the test pattern generation device 100 determines in step S903 that the stack is empty (Yes in step S903), the test pattern generation device 100 ends the series of processes.

FIG. 10 is a flowchart illustrating detailed description of a backward process of the data path (step S607) illustrated in FIG. 6. The test pattern generation device 100 initializes a number-of-data path stages table (step S1001). In step S1001, for example, the test pattern generation device 100 sets "dmin[*]=∞." Next, the test pattern generation device 100 pushes "net number=input of FF", "minimum number of stages=−cmin [CK of FF]", and {net number, minimum number of stages} to the stack in regard to the FF at which the clock path arrives (step S1002).

The test pattern generation device 100 determines whether the stack is empty (step S1003). When the test pattern generation device 100 determines that the stack is empty (No in step S1003), the test pattern generation device 100 pops {net number, minimum number of stages} from the stack (step S1004). The test pattern generation device 100 adds a clock number to the domain marker r [net number] (step S1005).

Next, the test pattern generation device 100 determines whether the minimum number of stages is dmin [net number] (step S1006). When the test pattern generation device 100 determines that the minimum number of stages is dmin [net number] (Yes in step S1006), the test pattern generation device 100 returns the process to step S1003. When the test pattern generation device 100 determines that the minimum number of stages is not dmin [net number] (No in step S1006), the test pattern generation device 100 sets "dmin= [net number]=minimum number of stages" (step S1007).

Next, the test pattern generation device 100 determines whether the net is an output of the FF (step S1008). When the test pattern generation device 100 determines that the net is the output of the FF (Yes in step S1008), the test pattern generation device 100 returns the process to step S1003. When the test pattern generation device 100 determines that the net is not the output of the FF (No in step S1008), the test pattern generation device 100 determines whether the net is a gate input (step S1009). When the test pattern generation device 100 determines that the net is the gate input (Yes in step S1009), the test pattern generation device 100 sets "net number=driver net", "minimum number of stages= minimum number of stages+1" (step S1010). The test pattern generation device 100 pushes {net number, minimum number of stages} to the stack (step S1011) and returns the process to step S1003.

Conversely, when the test pattern generation device 100 determines that the net is not the gate input (No in step S1009), the test pattern generation device 100 sets {minimum number of stages=min (dmin[f])+1" (step S1012). In step S1012, f indicates all of the fan-out destinations of the gate outputs. Next, the test pattern generation device 100 determines whether there are unprocessed nets among the input nets of the gates (step S1013).

When the test pattern generation device 100 determines that there are the unprocessed nets among the input nets of the gates (Yes in step S1013), the test pattern generation device 100 selects one input net i from the unprocessed input nets (step S1014). The test pattern generation device 100 pushes {i, minimum number of stages} to the stack (step S1015) and returns the process to step S1013.

Conversely, when the test pattern generation device 100 determines that there is no unprocessed net among the input nets of the gates (No in step S1013), the test pattern generation device 100 returns the process to step S1003. When the test pattern generation device 100 determines in step S1003 that the stack is empty (Yes in step S1003), the test pattern generation device 100 ends the series of processes.

Figure 11:
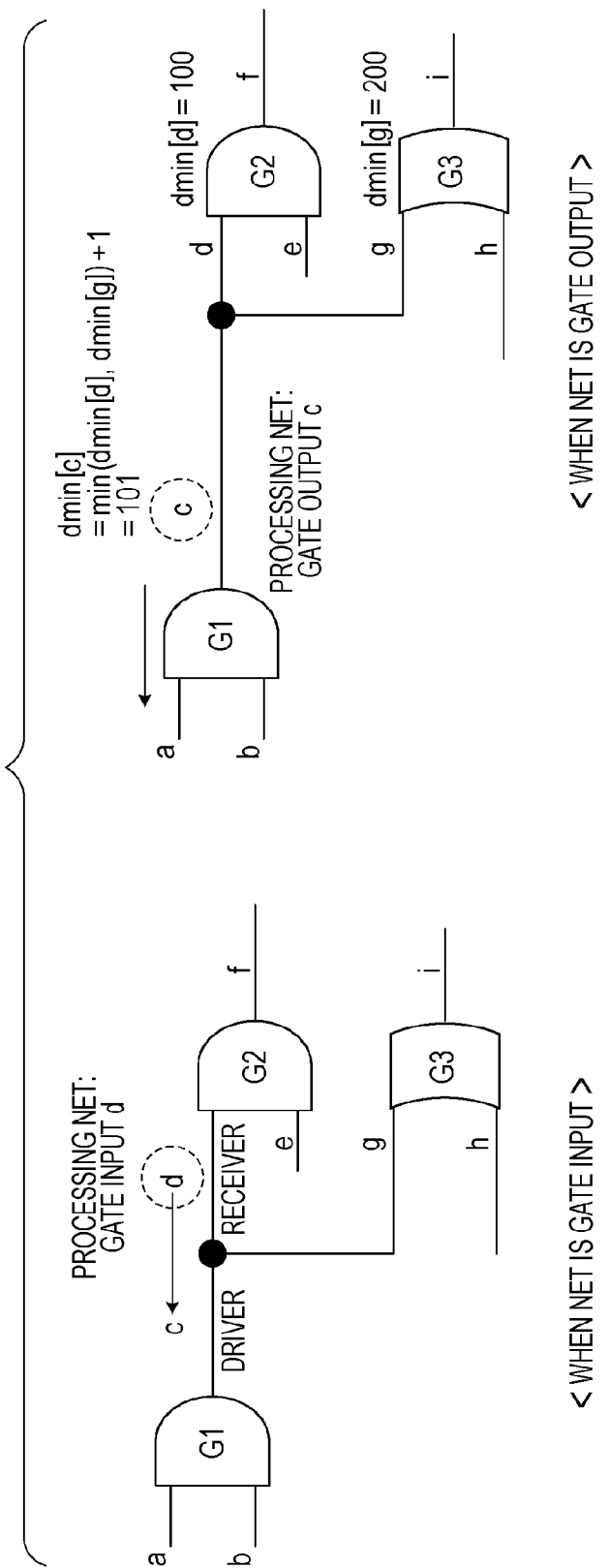
FIG. 11 is an explanatory diagram illustrating examples of a driver net and a gate input.

FIG. 11 is an explanatory diagram illustrating examples of the driver net and the gate input. When it is determined in step S1009 that the net is the gate input, the driver net at the time of "net number=driver net" in step S1010 is an output net of the previous stage since the driver net is a net driving the input net which is a receiver.

The case in which it is determined in step S1009 that the net is not the gate input refers to a case in which it is determined that the net is a gate output. In this case, the input net of the gate when it is determined in step S1013 whether there are the unprocessed nets among the input nets of the gates will be described. When the net c is a gate output of interest, a and b which are input nets of G1 which is a gate of the net c are input nets.

For example, when the net c is the gate output of interest, the test pattern generation device 100 calculates the minimum number of stages in the net c using dmin of the nets d and g which are the fan-output destinations of the net c. Then, the test pattern generation device 100 pushes the calculated minimum number of stages dmin[c] and a and b which are the input nets of G1 which is the gate of the net c together to the stack as in {a, dmin[c]} and {b, dmin[c]}.

Figure 12:
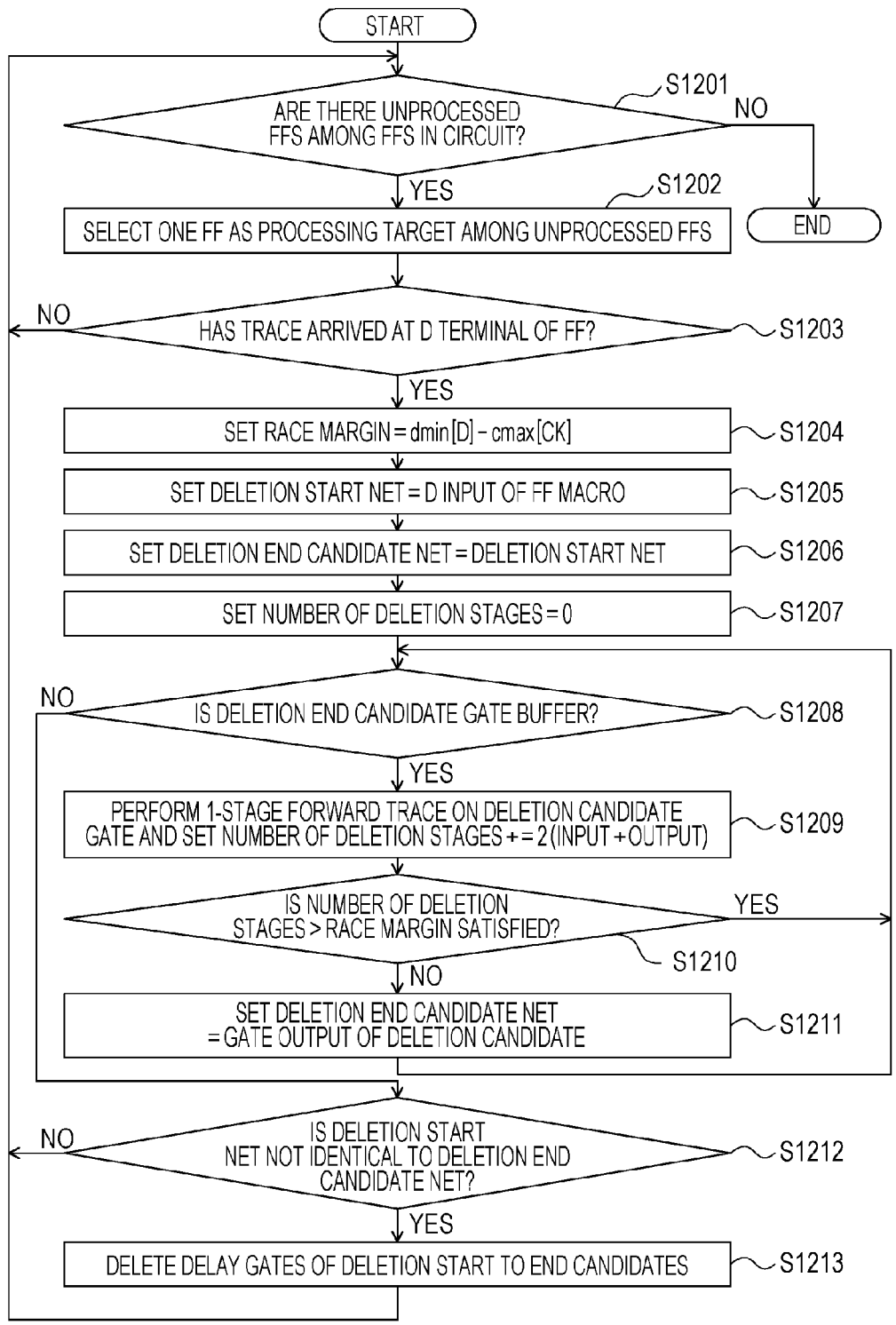
FIG. 12 is a flowchart illustrating detailed description of a receiving FF macro internal input deletion process (step S606) illustrated in FIG. 6.

FIG. 12 is a flowchart illustrating detailed description of a receiving FF macro internal input deletion process (step S606) illustrated in FIG. 6. The test pattern generation device 100 determines whether there are unprocessed FFs among the FFs in the circuit (step S1201). When the test pattern generation device 100 determines that there are the unprocessed FFs among the FFs in the circuit (Yes in step S1201), the test pattern generation device 100 selects one FF as a processing target from the unprocessed FFs (step S1202).

Next, the test pattern generation device 100 determines whether a trace has arrived at a D terminal of the FF (step S1203). When the test pattern generation device 100 determines that the trace has not arrived at the D terminal of the FF (No in step S1203), the test pattern generation device 100 returns the process to step S1201. Conversely, when the test pattern generation device 100 determines that the trace arrives at the D terminal of the FF (Yes in step S1203), the test pattern generation device 100 sets "race margin=dmin [D]−cmax [CK]" (step S1204).

Then, the test pattern generation device 100 sets "deletion start net=D input of FF macro" (step S1205). The test pattern generation device 100 sets "deletion end candidate net=deletion start net" (step S1206). The test pattern generation device 100 sets "number of deletion stages=0" (step S1207). The test pattern generation device 100 determines whether a candidate gate of the deletion end is a buffer (step S1208). When the test pattern generation device 100 determines that the deletion end candidate gate is the buffer (Yes in step S1208), the test pattern generation device 100 performs 1-stage forward trace on a deletion candidate gate and sets "number of deletion stages+=2" (step S1209). Adding 2 to the number of deletion stages is performed for input and output.

Then, the test pattern generation device 100 determines whether the number of deletion stages>the race margin is satisfied (step S1210). When the test pattern generation device 100 determines that the number of deletion stages>the race margin is satisfied (Yes in step S1210), the test pattern generation device 100 returns the process to step S1208. When the test pattern generation device 100 determines that the number of deletion stages>the race margin is not satisfied (No in step S1210), the test pattern generation device 100 sets the deletion end candidate net=a gate output of the deletion candidate (step S1211) and returns the process to step S1208.

Conversely, when the test pattern generation device 100 determines in step S1208 that the deletion end candidate gate is not the buffer (No in step S1208), the test pattern generation device 100 causes the process to proceeds to step S1212. The test pattern generation device 100 determines whether the deletion start net is not identical to the deletion end candidate net (step S1212). When the test pattern generation device 100 determines that the deletion start net is not identical to the deletion end candidate net (Yes in step S1212), the test pattern generation device 100 deletes the delay gates of deletion start to end candidates (step S1213) and returns the process to step S1201. When the test pattern generation device 100 determines that the deletion start net is identical to the deletion end candidate net (No in step S1212), the test pattern generation device 100 returns the process to step S1201.

When the test pattern generation device 100 determines in step S1201 that there is no unprocessed FF among the FFs in the circuit (No in step S1201), the test pattern generation device 100 ends the series of processes.

Figure 13:
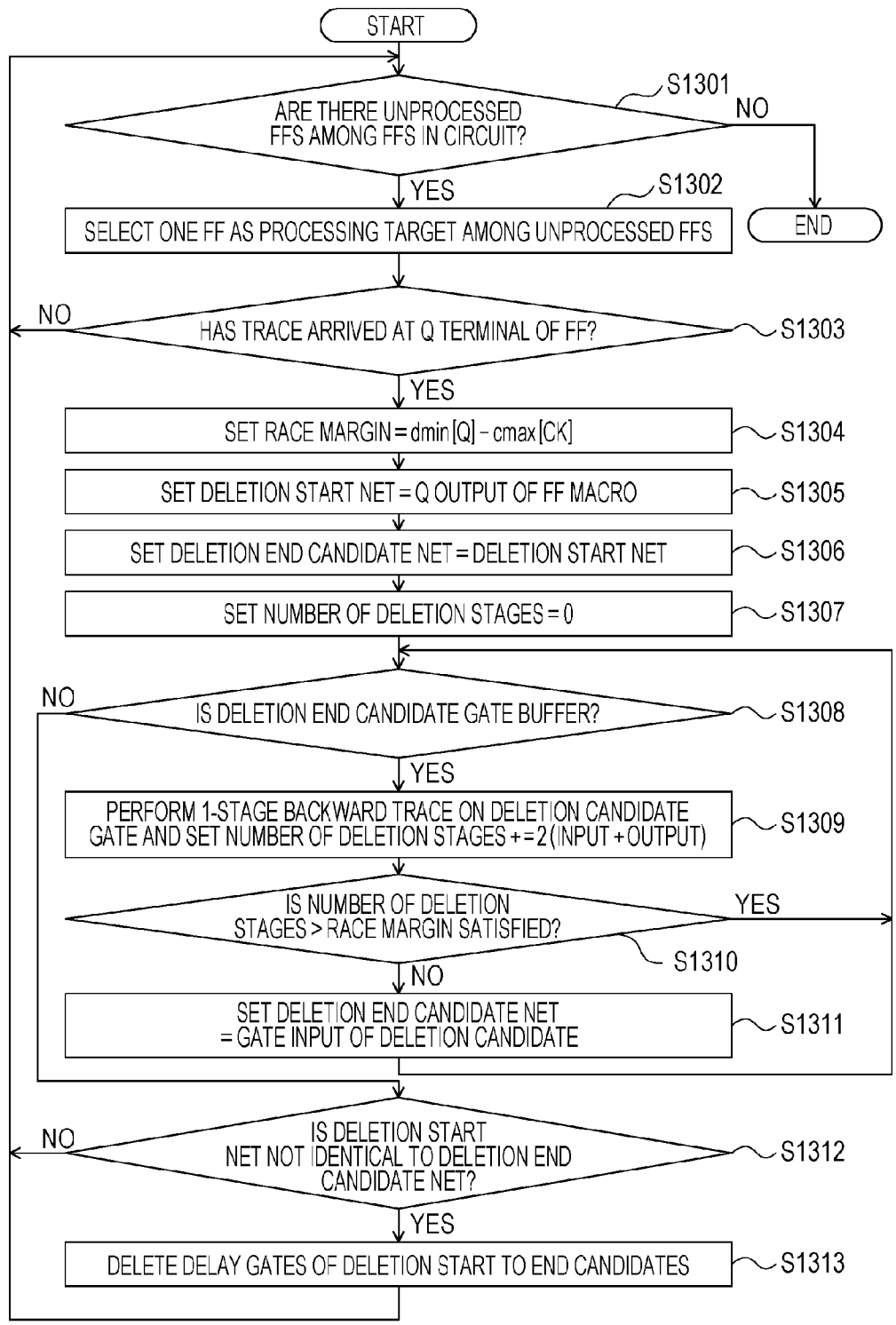
FIG. 13 is a flowchart illustrating detailed description of a sending FF macro internal input deletion process (step S608) illustrated in FIG. 6.

FIG. 13 is a flowchart illustrating detailed description of a sending FF macro internal output deletion process (step S608) illustrated in FIG. 6. First, the test pattern generation device 100 determines whether there are unprocessed FFs among the FFs in the circuit (step S1301). When the test pattern generation device 100 determines that there are the unprocessed FFs among the FFs in the circuit (Yes in step S1301), the test pattern generation device 100 selects one FF as a processing target from the unprocessed FFs (step S1302).

Next, the test pattern generation device 100 determines whether a trace has arrived at a Q terminal of the FF (step S1303). When the test pattern generation device 100 determines that the trace has not arrived at the Q terminal of the FF (No in step S1303), the test pattern generation device 100 returns the process to step S1301. Conversely, when the test pattern generation device 100 determines that the trace arrives at the Q terminal of the FF (Yes in step S1303), the test pattern generation device 100 sets "race margin=dmin [Q]−cmin [CK]" (step S1304). Then, the test pattern generation device 100 sets "deletion start net=Q output of FF macro" (step S1305).

Next, the test pattern generation device 100 sets "deletion end candidate net=deletion start net" (step S1306). The test pattern generation device 100 sets "number of deletion stages=0" (step S1307). The test pattern generation device 100 determines whether a candidate gate of the deletion end is a buffer (step S1308). When the test pattern generation device 100 determines that the deletion end candidate gate is the buffer (Yes in step S1308), the test pattern generation device 100 performs 1-stage backward trace on a deletion candidate gate and sets "number of deletion stages+=2"

(step S1309). Adding 2 to the number of deletion stages is performed for input and output.

Next, the test pattern generation device 100 determines whether the number of deletion stages>the race margin is satisfied (step S1310). When the test pattern generation device 100 determines that the number of deletion stages>the race margin is satisfied (Yes in step S1310), the test pattern generation device 100 returns the process to step S1308. When the test pattern generation device 100 determines that the number of deletion stages>the race margin is not satisfied (No in step S1310), the test pattern generation device 100 sets the deletion end candidate net=a gate input of the deletion candidate (step S1311) and returns the process to step S1308.

Conversely, when the test pattern generation device 100 determines in step S1308 that the deletion end candidate gate is not the buffer (No in step S1308), the test pattern generation device 100 determines whether the deletion start net is not identical to the deletion end candidate net (step S1312). When the test pattern generation device 100 determines that the deletion start net is not identical to the deletion end candidate net (Yes in step S1312), the test pattern generation device 100 deletes the delay gates of deletion start to end candidates (step S1313) and returns the process to step S1301.

Conversely, when the test pattern generation device 100 determines that the deletion start net is identical to the deletion end candidate net (No in step S1312), the test pattern generation device 100 returns the process to step S1301. When the test pattern generation device 100 determines in step S1301 that there is no unprocessed FF among the FFs in the circuit (No in step S1301), the test pattern generation device 100 ends the series of processes.

<Dividing of Blocks>

Next, an example of division of the block included in the target circuit will be described. In technologies of the related art, test pattern generation is performed in some cases by dividing a plurality of blocks, assigning the blocks to a plurality of computers, and performing parallel processing. In the parallel processing, loads of the computers may be equalized to shorten a processing time. In recent years, I/O units or RAMs have substantially the same scales as CPUs to increase scales associated with high functions of the I/O units, the RAMs, or the like. Therefore, when a plurality of blocks are divided in accordance with the number of gates, a problem arises in that the blocks with the same functions or configurations are unevenly distributed to specific divided circuits in some cases, for example, in such a manner that only I/O units are assigned to a first divided circuit and only CPUs are assigned to a second divided circuit.

When the blocks with the same function or configuration are unevenly distributed to specific divided circuits, there is a possibility of a clock domain or the like being different between the divided circuits. Even in parallel processing performed on a plurality of divided circuits, operating circuit portions are also different when the characteristics of the clock domains of the blocks included in the divided circuits are different. Therefore, a processing time of a simulation or the like is also different between the divided circuits. Accordingly, efficiency of the entire parallel processing deteriorates due to end waiting of the divided circuit in which the processing is the slowest.

Accordingly, in the embodiment, the test pattern generation device 100 groups blocks based on closeness to feature amounts regarding scales and functions and assigns the blocks of the groups to the divided circuits based on a ratio of the number of blocks to the division number. Thus, it is possible to equalize the characteristics between the divided circuits.

In technologies of the related art, the scales of divided circuits are estimated in some cases by adding the scales of the blocks selected to be included in the divided circuits. However, in actual circuit division, logic completion should be achieved, and thus blocks other than the blocks selected to be included in the divided circuits may be included in the divided circuits in connection from control circuits such as clock systems or adjacent blocks. Therefore, a problem arises in that the connection portions become errors from the estimation depending on the blocks and deviation of characteristics of the scales of the divided circuits occurs.

Accordingly, in the embodiment, the test pattern generation device 100 assigns the blocks included in the groups so that a sum value of the numbers of nets of connection between the blocks for which a connection range from a scan FF which is an observation point of the block to a scan FF of a previous stage is obtained through back-trace is the minimum. Thus, it is possible to improve estimation precision of the circuit scale after the division. Thus, it is possible to further equalize the characteristics between the divided circuits.

First, for example, the acquisition unit 304 acquires circuit information indicating gates in a design target circuit or a connection relation between the gates. Here, the circuit information is the circuit information 342, but may be the circuit information 341. The circuit information 342 is a netlist. For example, the netlist is described at a gate level or the like. As an acquisition form, for example, the acquisition unit 304 may acquire the circuit information 342 from another device via the network 209. For example, the acquisition unit 304 may acquire the circuit information 342 by reading the circuit information 342 from a storage device such as the RAM 203, the ROM 202, or the disc 205.

In each of the plurality of blocks included in the target circuit, the acquisition unit 304 acquires the first feature amount regarding the size of the block based on the circuit information 342 and the second feature amount regarding the function of the block based on the circuit information 342. The first feature amount is for example, the number of nets. The second feature amount is, for example, the number of scan FFs.

In each of the blocks, the acquisition unit 304 acquires the third feature amount regarding a path from an FF included in the block based on the circuit information 342 to an FF present in the previous stage of the FF. The third feature amount is, for example, the number of trace nets. The number of trace nets is the number of nets of connection between the blocks for which a connection range from a scan FF which is an observation point of the block to a scan FF of a previous stage is obtained through back-trace.

Specifically, for example, the acquisition unit 304 acquires block information indicating a hierarchy name, the number of nets, the number of scan FFs, and the number of trace nets in each of the blocks. The block information is as follows, for example: block information {number of nets, number of scan FFs, number of trace nets}.

As an acquisition form, for example, the acquisition unit 304 may acquire the block information from another device via the network 209. For example, the acquisition unit 304 may acquire the block information by reading the block information from a storage device such as the RAM 203, the ROM 202, or the disc 205. For example, in each of the blocks, the acquisition unit 304 may extract the number of nets, the number of scan FFs, and the number of trace nets based on the circuit information 342.

Figure 14:
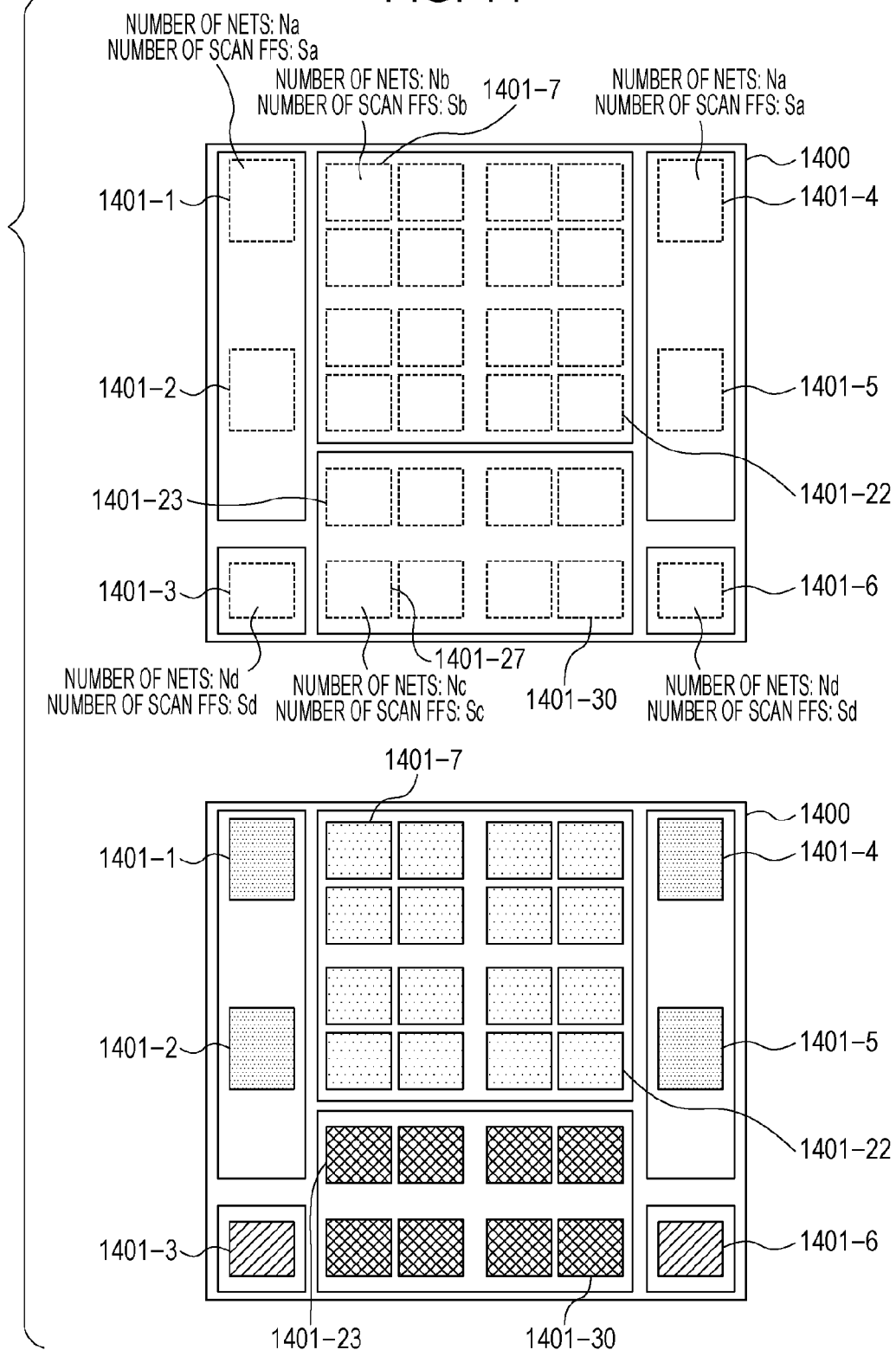
FIG. 14 is an explanatory diagram illustrating a feature extraction example of block information.

FIG. 14 is an explanatory diagram illustrating a feature extraction example of block information. A target circuit 1400 includes a plurality of blocks 1401-1 to 1401-30. In the block 1401-1, for example, the number of nets is Na and the number of scan FFs is Sa. In the block 1401-4, for example, the number of nets is Na and the number of scan FFs is Sa. In the block 1401-6, for example, the number of nets is Nd and the number of scan FFs is Sd. In the block 1401-7, for example, the number of nets is Nb and the number of scan FFs is Sb. In the block 1401-27, for example, the number of nets is Nc and the number of scan FFs is Sc. In the numbers of nets, a relation of Na>Nb>Nc>Nd is assumed. In the numbers of scan FFs, a relation of Sa≠Sb≠Sc≠Sd is assumed. To facilitate the understanding, on the lower side of FIG. 14, the same hatchings are given to the blocks 1401 in which the number of nets and the number of scan FFs are the same.

Figure 23:
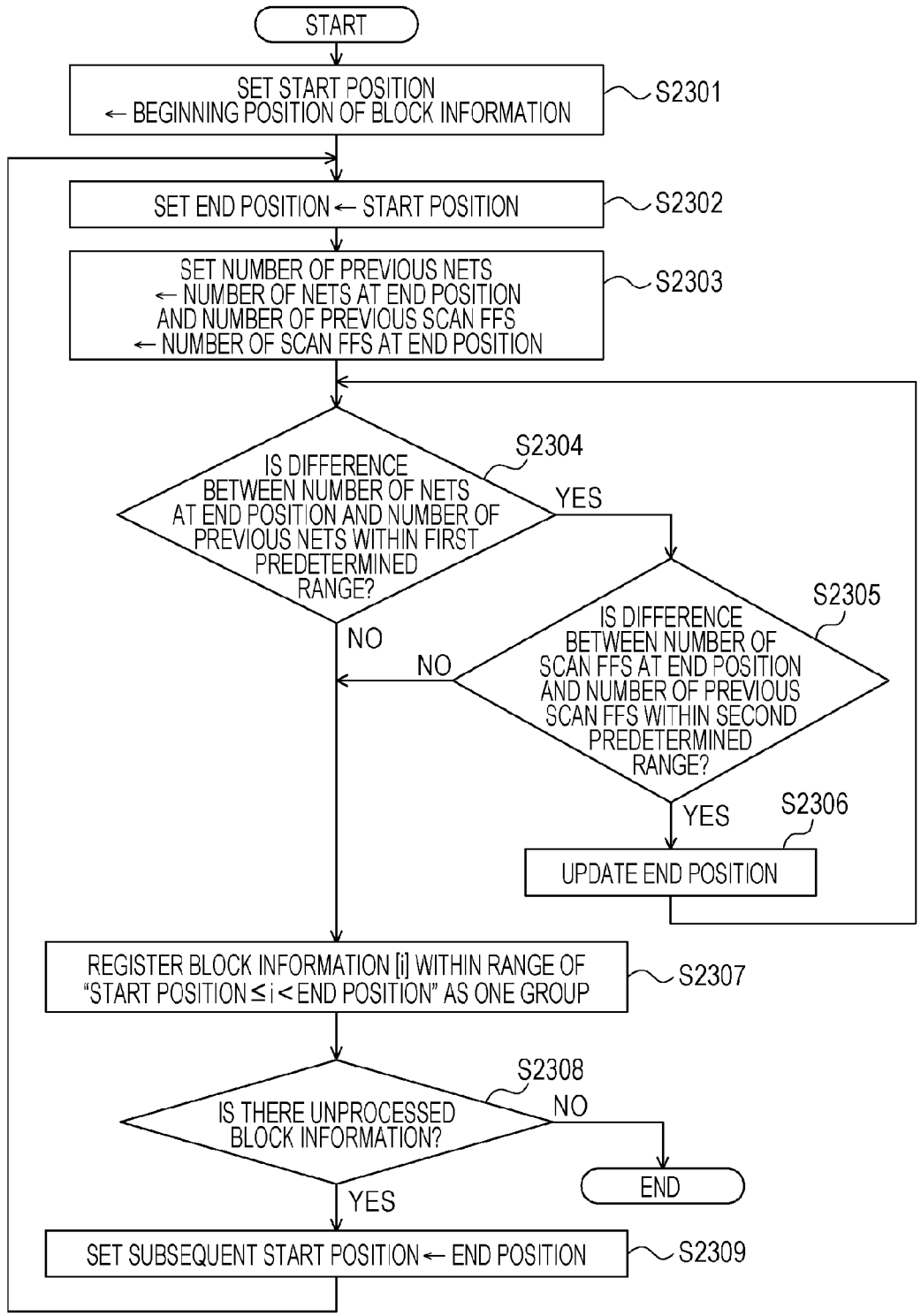
FIG. 23 is a flowchart illustrating detailed description of a block information group recognition process (step S2103) illustrated in FIG. 21.

The classification unit 305 classifies the plurality of blocks 1401 into a plurality of groups less than the number of plurality of blocks 1401 so that the blocks 1401 in which the first feature amount is within the first predetermined range and the second feature amount is within the second predetermined range belong to the same groups. The first and second predetermined ranges are decided in advance by a user. For example, the classification unit 305 classifies the plurality of blocks 1401 so that the plurality of blocks 1401 having the block information in which a difference in the number of nets included in the block information is within the first predetermined range and a difference in the number of scan FFs is within the second predetermined range belong to the same groups. The designated ranges are ranges designated in advance by a user such as a designer or a test pattern generation operant. The classification unit 305 may classify the blocks so that the blocks having the block information in which there is no difference in each feature amount belong to the same group. The detailed groups by the classification unit 305 are illustrated in FIGS. 22 and 23. Group information indicating each group is as follows, for example: group information {classified block information, classified block information}.

For example, in FIG. 14, the classification unit 305 classifies the blocks so that the blocks 1401-1, 1401-2, 1401-4, and 1401-5 belong to the same group. Classification results of the other groups are illustrated in FIGS. 15A and 15B.

In each of the plurality of groups, the assignment unit 306 assigns the blocks 1401 included in the group to one of a plurality of divided circuits 1600 of a division number based on a ratio of the number of blocks 1401 included in the group to the division number. In each of the groups, the assignment unit 306 assigns the blocks 1401 included in the group in accordance with an interval according to the ratio and different orders assigned to the plurality of divided circuit. The interval according to the ratio is also referred to a distribution interval. The assignment unit 306 assigns the blocks included in the group so that a sum value of the third feature amounts in the plurality of divided circuits is the minimum when the blocks are assigned to the plurality of divided circuits in accordance with the distribution interval and the orders. In the embodiment, the assignment is also referred to as distribution. As described above, the third feature amount is the number of trace nets. Specifically, the assignment unit 306 includes a distribution interval decision unit 331 and a distribution destination decision unit 332.

For example, based on the number of blocks 1401 included in the group and the division number, the distribution interval decision unit 331 decides the distribution interval for distributing the blocks 1401 included in the group at an equal interval when the plurality of divided circuits 1600 are arranged. For example, the division number is designated via the input device 207 by a user such as a designer or a test pattern generation operant.

For example, a case in which the number of blocks 1401 included in the group has no fraction with respect to the division number, for example, the division number is 16 and the number of blocks 1401 included in the group is 2, 4, 8, or 16, will be described. The distribution interval decision unit 331 sets the distribution interval as the number of blocks 1401 included in the division number/group. Thus, it is possible to suppress occurrence of deviation in the function between the divided circuits 1600 due to uneven distribution of the blocks 1401 included in the group to the divided circuits 1600. By suppressing the deviation in the function between the divided circuits 1600, it is possible to suppress deviation in a test pattern generation time when the test pattern generation is performed through the parallel processing on the plurality of divided circuits 1600. Thus, it is possible to shorten the test pattern generation time.

Figure 24:
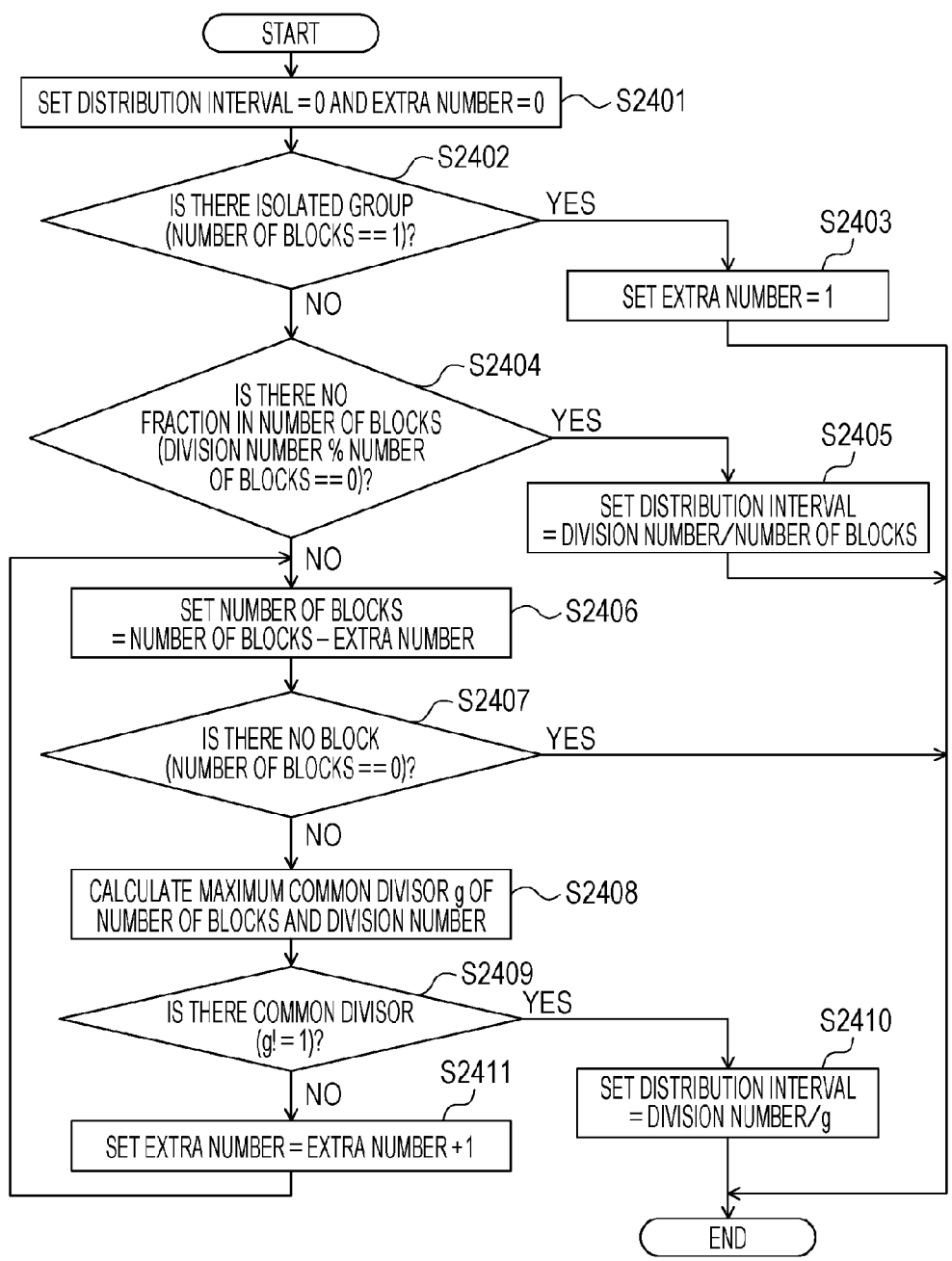
FIG. 24 is a flowchart illustrating detailed description of a distribution internal decision process (step S2106) illustrated in FIG. 21.

For example, when there is a remainder at the time of dividing the division number by the number of blocks 1401 included in the group, the assignment unit 306 assigns the remainder number of blocks 1401 among the blocks 1401 included in the group to the divided circuits 1600 different from the plurality of divided circuits 1600. In the embodiment, when the number of blocks 1401 included in the group has a fraction with respect to the division number, the divided circuits 1600 corresponding to the extra are assumed to be prepared. When the number of blocks 1401 included in the group has a fraction with respect to the division number, the distribution interval decision unit 331 sets a number obtained by subtracting the extra from the number of bocks 1401 included in the group to the new number of blocks 1401. When the greatest common divisor of the number of blocks 1401 and the division number is not 1, the distribution interval decision unit 331 decides division number/g as the distribution interval. When the greatest common divisor of the number of blocks 1401 and the division number is 1, the distribution interval decision unit 331 further repeats the process of setting the blocks 1401 as an extra and the process of deciding the distribution interval when the greatest common divisor is 1. A detailed process example performed by the distribution interval decision unit 331 is illustrated in FIG. 24 to be described below.

FIGS. 15A and 15B are explanatory diagrams illustrating examples of a classification result and a distribution interval. FIG. 15A illustrates an example of the classification result and FIG. 15B illustrates an example of the distribution interval.

As illustrated in FIG. 15A, a group 1501-1 includes the blocks 1401-1, 1401-2, 1401-4, and 1401-5. As illustrated in FIG. 15A, a group 1501-2 includes the blocks 1401-7 to 1401-22. As illustrated in FIG. 15A, a group 1501-3 includes the blocks 1401-23 to 1401-30. As illustrated in FIG. 15A, a group 1501-4 includes the blocks 1401-3 and 1401-6.

As illustrated in FIG. 15B, since the number of blocks 1401 included in the group 1501-1 is 4 and the division number is 16, the distribution interval of the group 1501-1 is 4. As illustrated in FIG. 15B, since the number of blocks 1401 included in the group 1501-2 is 16 and the division number is 16, the distribution interval of the group 1501-2 is 1.

As illustrated in FIG. 15B, since the number of blocks 1401 included in the group 1501-3 is 8 and the division number is 16, the distribution interval of the group 1501-3 is 2. As illustrated in FIG. 15B, since the number of blocks 1401 included in the group 1501-4 is 16 and the division number is 2, the distribution interval of the group 1501-4 is 8.

The distribution destination decision unit 332 selects one undistributed group 1501 from the plurality of groups 1501. Here, it is assumed that there is a sequence of the plurality of divided circuits 1600. When the blocks 1401 included in the selected group 1501 are distributed to the plurality of divided circuits 1600 at each of the decided distribution intervals, the distribution destination decision unit 332 decides a distribution destination for which a sum value of the third feature amounts of each of the divided circuits 1600 is the smallest. The distribution destination decision unit 332 stores the decision result of the distribution destination as a circuit division list 345 in a storage device such as the ROM 202, the RAM 203, or the disc 205.

Figure 16A:
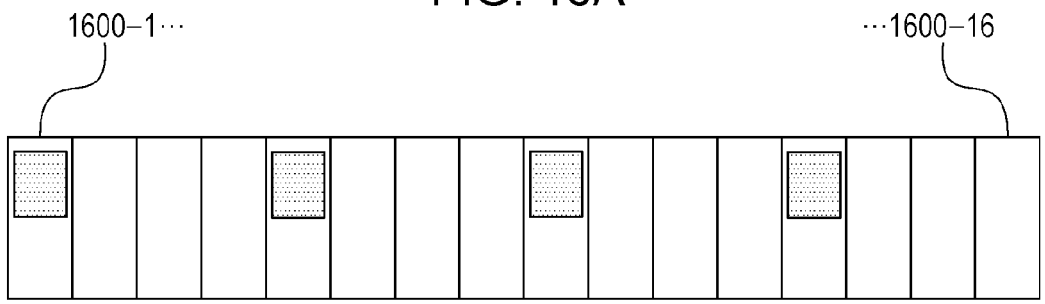
FIGS. 16A to 16D are explanatory diagrams illustrating distribution examples.
Figure 16B:
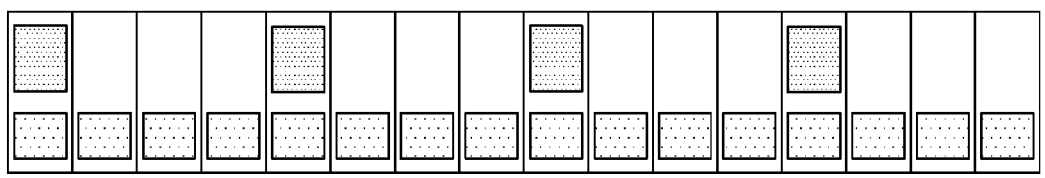
Figure 16C:
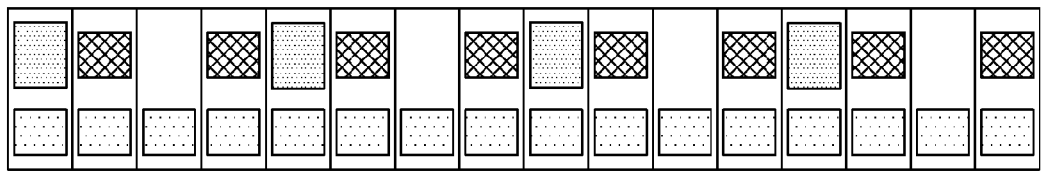
Figure 16D:
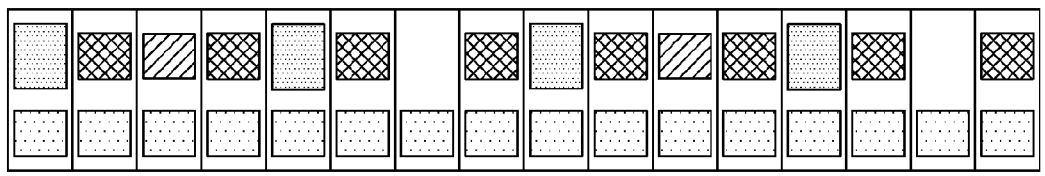

FIGS. 16A to 16D are explanatory diagrams illustrating distribution examples. FIG. 16A illustrates a distribution result example of the blocks 1401 included in the group 1501-1. FIG. 16B illustrates a distribution result example of the blocks 1401 included in the group 1501-2, added to FIG. 16A. FIG. 16C illustrates a distribution result example of the blocks 1401 included in the group 1501-3, added to FIG. 16B. FIG. 16D illustrates a distribution result example of the blocks 1401 included in the group 1501-4, added to FIG. 16C.

First, since the distribution interval is 4 in the group 1501-1, distribution destinations are (1, 5, 9, 13), (2, 6, 10, 14), (3, 7, 11, 15), and (4, 8, 12, 16). Further, each numerical value in ( ) is a number for identifying the divided circuit 1600 and the plurality of divided circuits 1600 are sequenced by the numbers.

For example, the distribution destination decision unit 332 calculates a sum value of the number of trace nets when the blocks are distributed to the distribution destinations. The sum value of the number of trace nets is also referred to as the number of accumulative trace nets. In the stage in which the group 1501-1 is selected, all of the blocks are not distributed. Therefore, the number of accumulative trace nets is the same even when the blocks are distributed to any of the distribution destinations. Therefore, as illustrated in FIG. 16A, for the group 1501-1, the distribution destination decision unit 332 decides that the distribution destinations are (1, 5, 9, 13).

Next, as illustrated in FIG. 16B, the distribution destination decision unit 332 evenly assigns the blocks 1401 included in the group 1501 to all of the divided circuits 1600 since the distribution interval of the group 1501-2 is 16.

Since the distribution interval for the group 1501-3 is 2, the distribution destinations are (1, 3, 5, 7, 9, 11, 13, 15) and (2, 4, 6, 8, 10, 12, 14, 16). Since the blocks 1401 included in the group 1501-1 are already distributed to (1, 5, 9, 13), the number of accumulative trace nets becomes larger. Therefore, as illustrated in FIG. 16C, the distribution destination decision unit 332 decides (2, 4, 6, 8, 10, 12, 14, 16) as the distribution destinations to the group 1501-3.

Since the distribution interval for the group 1501-4 is 8, the distribution destinations are (1, 9), (2, 10), (3, 11), (4, 12), (5, 13), (6, 14), (7, 15), and (8, 16). The distribution destinations in which the number of accumulative trace nets is the smallest are (3, 11) and (7, 15). Therefore, as illustrated in FIG. 16D, the distribution destination decision unit 332 decides (3, 11) as the distribution destinations to the group 1501-4.

Next, each process will be described giving a more specific example.

FIGS. 17A to 17C are explanatory diagrams illustrating block grouping examples. First, as illustrated in FIG. 17A, the acquisition unit 304 acquires the block information having three feature amounts, that is, the number of nets, the number of scan FFs, and the number of trace nets in each of blocks 1700.

Next, as illustrated in FIG. 17B, the classification unit 305 sets the number of nets and the number of scan FFs as first and second keys, respectively, and sorts the block information in a descending order so that the first key has priority over the second key. Thus, it is possible to facilitate equivalent or similar determination of the feature amounts.

As illustrated in FIG. 17C, the classification unit 305 selects the sorted block information in order from a higher rank. Then, the classification unit 305 classifies the blocks 1700 in which the number of nets is within a predetermined range and the number of scan FFs is a predetermined range to the same groups 1701. A group 1701-1 includes blocks 1700-7 to 1700-10. A group 1701-2 includes blocks 1700-1 to 1700-4. A group 1701-3 includes blocks 1700-5 and 1700-6.

FIG. 18 is an explanatory diagram illustrating a code example of a distribution interval decision method. In a code 1800, a decision process for the distribution interval when the division number is 16 is coded. In the description of the code 1800, "width" is a distribution interval. In the description of the code 1800, "extra" is an extra number. As illustrated in the code 1800, the distribution interval decision unit 331 decides the distribution interval so that extra blocks 1700 among the blocks 1700 included in the groups 1701 are distributed to extra divided circuits. The distribution interval decision unit 331 decides the distribution interval based on the greatest common divisor of the division number and the number of blocks 1700 in the groups 1701.

Figures 19A, 19B:
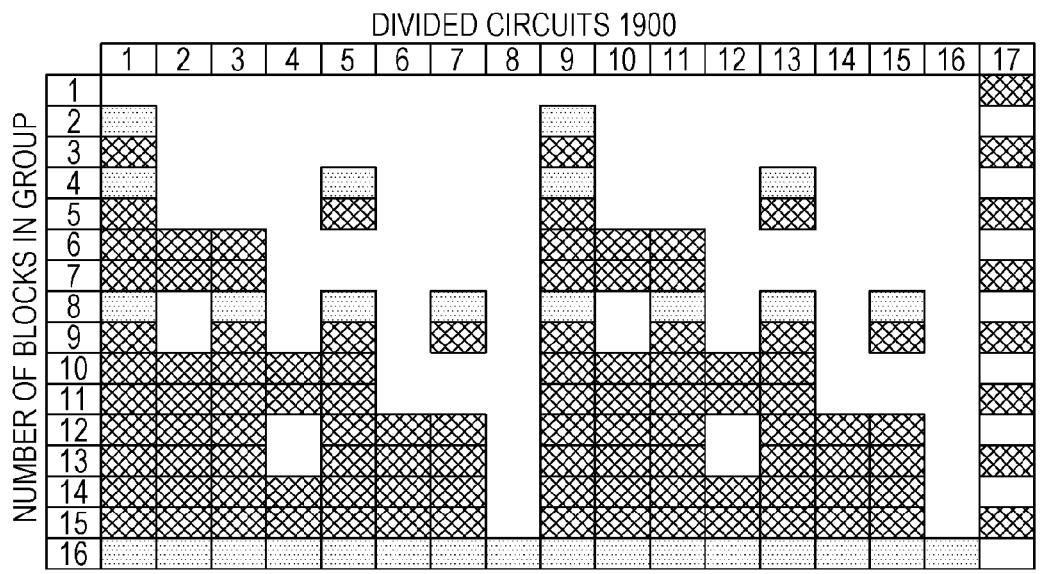
FIGS. 19A and 19B are explanatory diagrams illustrating a decision example of the distribution interval.

FIGS. 19A and 19B are explanatory diagrams illustrating a decision example of the distribution interval. Here, an example of a case in which the division number is 16 will be described. In FIG. 19A, the distribution interval and the extra number according to the number of blocks 1700 included in the group 1701 are illustrated. "width" is the distribution interval, "extra" is the extra number, and "[numerical value]" is the distribution destination. [17] is the extra divided circuits 1900.

FIG. 19B illustrates the distribution interval and the distribution example according to the number of blocks 1700 in the groups 1701. For example, since the number of blocks 1700 in the groups 1701 is 1, the distribution interval is 0, and the extra number is 1, the distribution destination of the blocks 1700 is an extra divided circuit 1900-17.

For example, the number of blocks 1700 in the groups 1701 is 5, the distribution interval 4, and the extra number is 1. Therefore, the distribution destinations of the blocks 1700 are divided circuits 1900-1, 1900-5, 1900-9, and 1900-13 and the extra divided circuit 1900-17.

The distribution intervals of the groups 1701-1 and 1701-2 illustrated in FIGS. 17A to 17C are 4 and the distribution interval of the group 1701-3 is 8.

FIGS. 20A to 20D are explanatory diagrams illustrating block distribution examples. Next, the distribution destination decision unit 332 derives a sum value of the numbers of trace nets of the blocks 1700 distributed to the divided circuits 1900 when the blocks 1700 included in the groups 1701 are distributed to the plurality of divided circuits 1900 based on the distribution intervals of the blocks 1700. Thus, it is possible to equalize the circuit scales between the divided circuits 1900. The signs of the blocks 1700 and the groups 1701 in FIGS. 20A to 20D are omitted.

As illustrated in FIG. 20A, 0 is set to the number of accumulative trace nets in each of the divided circuits 1900 since the blocks 1700 are not distributed to the divided circuits 1900 in all of the groups 1701.

First, when the blocks 1700 included in the group 1701-1 are distributed to the plurality of divided circuits 1900, the distribution interval is 4, and therefore the distribution destinations are (1, 5, 9, 13), (2, 6, 10, 14), and (3, 7, 11, 15). Since the number of accumulative trace nets is the same in all of the distribution destinations, as illustrated in FIG. 20B, the distribution destination decision unit 332 decides (1, 5, 9, 13) as the distribution destinations of the blocks 1700 included in the group 1701-1.

Next, since the distribution interval of the group 1701-2 is 4, the distribution destinations to the group 1701-2 are (1, 5, 9, 13), (2, 6, 10, 14), and (3, 7, 11, 15), as in the group 1701-1. Next, as illustrated in FIG. 20C, the distribution destination decision unit 332 calculates the number of accumulative trace nets when the blocks 1700 included in the group 1701-2 are distributed.

The numbers of accumulative trace nets of (1, 5, 9, 13) when the distribution destinations to the group 1701-2 are (1, 5, 9, 13) are (22, 637, 145; 22, 637, 973; 22, 616, 152; 22, 618, 314). The numbers of accumulative trace nets of (2, 6, 10, 14) when the distribution destinations to the group 1701-2 are (2, 6, 10, 14) are (10, 110, 410; 10, 110, 643; 10, 098, 647; 10, 099, 870). The numbers of accumulative trace nets of (3, 7, 11, 15) when the distribution destinations to the group 1701-2 are (3, 7, 11, 15) are (10, 110, 410; 10, 110, 643; 10, 098, 647; 10, 099, 870).

In the cases of (2, 6, 10, 14) and (3, 7, 11, 15), the number of accumulative trace nets decreases. Therefore, the distribution destination decision unit 332 decides (2, 6, 10, 14) as the distribution destinations to the group 1701-2. FIG. 20C illustrates the number of accumulative trace nets when the blocks 1700 included in the group 1701-2 are distributed to (2, 6, 10, 14).

Similarly, the distribution destination decision unit 332 decides (3, 11) as the distribution destinations to the group 1701-3. FIG. 20D illustrates the number of accumulative trace nets when the blocks 1700 included in the group 1701-3 are distributed to (3, 11). As described above, the distribution destination decision unit 332 decides the distribution destinations of the blocks 1700 included in the groups 1701 to all of the groups 1701.

Procedure Example of Circuit Division List Generation Process Performed by Test Pattern Generation Device 100

FIG. 21 is a flowchart illustrating a procedure example of a circuit division list generation process performed by the test pattern generation device. First, the test pattern generation device 100 acquires the block information (step S2101). Next, the test pattern generation device 100 performs a block information sorting process (step S2102). Then, the test pattern generation device 100 performs a block information group recognition process (step S2103).

Subsequently, the test pattern generation device 100 determines whether there are unprocessed groups (step S2104). When the test pattern generation device 100 determines that there are the unprocessed groups (Yes in step S2104), the test pattern generation device 100 selects one group as a processing target from the unprocessed groups (step S2105). Then, the test pattern generation device 100 performs a distribution interval decision process (step S2106). Next, the test pattern generation device 100 performs a detailed position set decision process (step S2107).

Subsequently, the test pattern generation device 100 performs a circuit division list generation process (step S2108) and returns the process to step S2104. Conversely, when the test pattern generation device 100 determines in step S2104 that there is no unprocessed group (No in step S2104), the test pattern generation device 100 ends the series of processes.

FIG. 22 is a flowchart illustrating detailed description of the block information sorting process (step S2102) illustrated in FIG. 21. First, the test pattern generation device 100 sorts the block information in the descending order in accordance with the number of nets (step S2201). Next, the test pattern generation device 100 sets a start position←the beginning position of the block information (step S2202).

Then, the test pattern generation device 100 sets an end position←the start position (step S2203). Next, the test pattern generation device 100 sets the number of previous nets←the number of nets at the end position (step S2204). The test pattern generation device 100 determines whether the number of nets at the end position is identical to the number of previous nets (step S2205).

When the test pattern generation device 100 determines that the number of nets at the end position is identical to the number of previous nets (Yes in step S2205), the test pattern generation device 100 updates the end position (step S2206) and returns the process to step S2205. When the test pattern generation device 100 determines that the number of nets at the end position is not identical to the number of previous nets (No in step S2205), the test pattern generation device 100 sorts the block information [i] within a range of "start position i≤end←position" in the descending order by the number of scan FFs (step S2207).

Next, the test pattern generation device 100 determines whether there is the unprocessed block information (step S2208). When the test pattern generation device 100 determines that there is the unprocessed block information (Yes in step S2208), the test pattern generation device 100 sets the subsequent start position←the end position (step S2209) and returns the process to step S2203. When the test pattern generation device 100 determines that there is no unprocessed block information (No in step S2208), the test pattern generation device 100 ends the series of processes.

FIG. 23 is a flowchart illustrating detailed description of the block information group recognition process (step S2103) illustrated in FIG. 21. First, the test pattern generation device 100 sets a start position←the beginning position of the block information (step S2301). Next, the test pattern generation device 100 sets an end position←the start position (step S2302).

Then, the test pattern generation device 100 sets the number of previous nets←the number of nets at the end position and the number of previous scan FFs←the number of scan FFs at the end position (step S2303). Next, the test pattern generation device 100 determines whether a difference between the number of nets at the end position and the number of previous nets is within the first predetermined range (step S2304). When the test pattern generation device 100 determines that the difference between the number of nets at the end position and the number of previous nets is not within the first predetermined range (No in step S2304), the test pattern generation device 100 causes the process to proceed to step S2307.

When the test pattern generation device 100 determines that the difference between the number of nets at the end position and the number of previous nets is within the first predetermined range (Yes in step S2304), the test pattern generation device 100 determines whether a difference between the number of scan FFs at the end position and the number of previous scan FFs is within the second predetermined range (step S2305). When the test pattern generation device 100 determines that the difference between the number of scan FFs at the end position and the number of previous scan FFs is within the second predetermined range (Yes in step S2305), the test pattern generation device 100 updates the end position (step S2306) and returns the process to step S2304.

Conversely, when the test pattern generation device 100 determines that the difference between the number of scan FFs at the end position and the number of previous scan FFs is not within the second predetermined range (No in step S2305), the test pattern generation device 100 registers the block information [i] within the range of "start position≤i<end position" as one group (step S2307). The test pattern generation device 100 determines whether there is the unprocessed block information (step S2308).

When the test pattern generation device 100 determines that there is the unprocessed block information (Yes in step S2308), the test pattern generation device 100 sets the subsequent start position←the end position (step S2309) and returns the process to step S2302. When the test pattern generation device 100 determines that there is no unprocessed block information (No in step S2308), the test pattern generation device 100 ends the series of processes.

FIG. 24 is a flowchart illustrating detailed description of the distribution internal decision process (step S2106) illustrated in FIG. 21. First, the test pattern generation device 100 sets the distribution interval=0 and the extra number=0 (step S2401). Next, the test pattern generation device 100 determines whether a processing target group is an isolated group (step S2402). In step S2402, specifically, the test pattern generation device 100 determines whether the processing target group is the isolated group by determining whether the number of blocks is 1.

When the test pattern generation device 100 determines that the processing target group is the isolated group (Yes in step S2402), the test pattern generation device 100 sets the extra number=1 (step S2403) and ends the series of processes. When the test pattern generation device 100 determines that the processing target group is not the isolated group (No in step S2402), the test pattern generation device 100 determines whether there is no fraction in the number of blocks (step S2404). In step S2404, specifically, the test pattern generation device 100 determines whether "division number % number of blocks" is 0.

When the test pattern generation device 100 determines that there is no fraction in the number of blocks (Yes in step S2404), the test pattern generation device 100 sets "distribution interval=division number/number of blocks" (step S2405) and ends the series of processes. When the test pattern generation device 100 determines that there is the fraction in the number of blocks (No in step S2404), the test pattern generation device 100 sets "number of blocks=number of blocks−extra number" (step S2406).

The test pattern generation device 100 determines whether there is no block (step S2407). In step S2407, the test pattern generation device 100 determines whether there is no block by determining whether the number of blocks is 0. When the test pattern generation device 100 determines that there is no block (Yes in step S2407), the test pattern generation device 100 ends the series of processes. Conversely, when the test pattern generation device 100 determines that there is the block (No in step S2407), the test pattern generation device 100 calculates a maximum common divisor g of the number of blocks and the division number (step S2408).

Next, the test pattern generation device 100 determines whether there is a common divisor (step S2409). In step S2409, for example, the test pattern generation device 100 determines whether g is not 1. When the test pattern generation device 100 determines that there is no common divisor (No in step s2409), the test pattern generation device 100 sets "extra number=extra number+1" (step S2411) and returns the process to step S2406. When the test pattern generation device 100 determines that there is the common divisor (Yes in step S2409), the test pattern generation device 100 sets "distribution interval=division number/g" (step S2410) and ends the series of processes.

Figure 25:
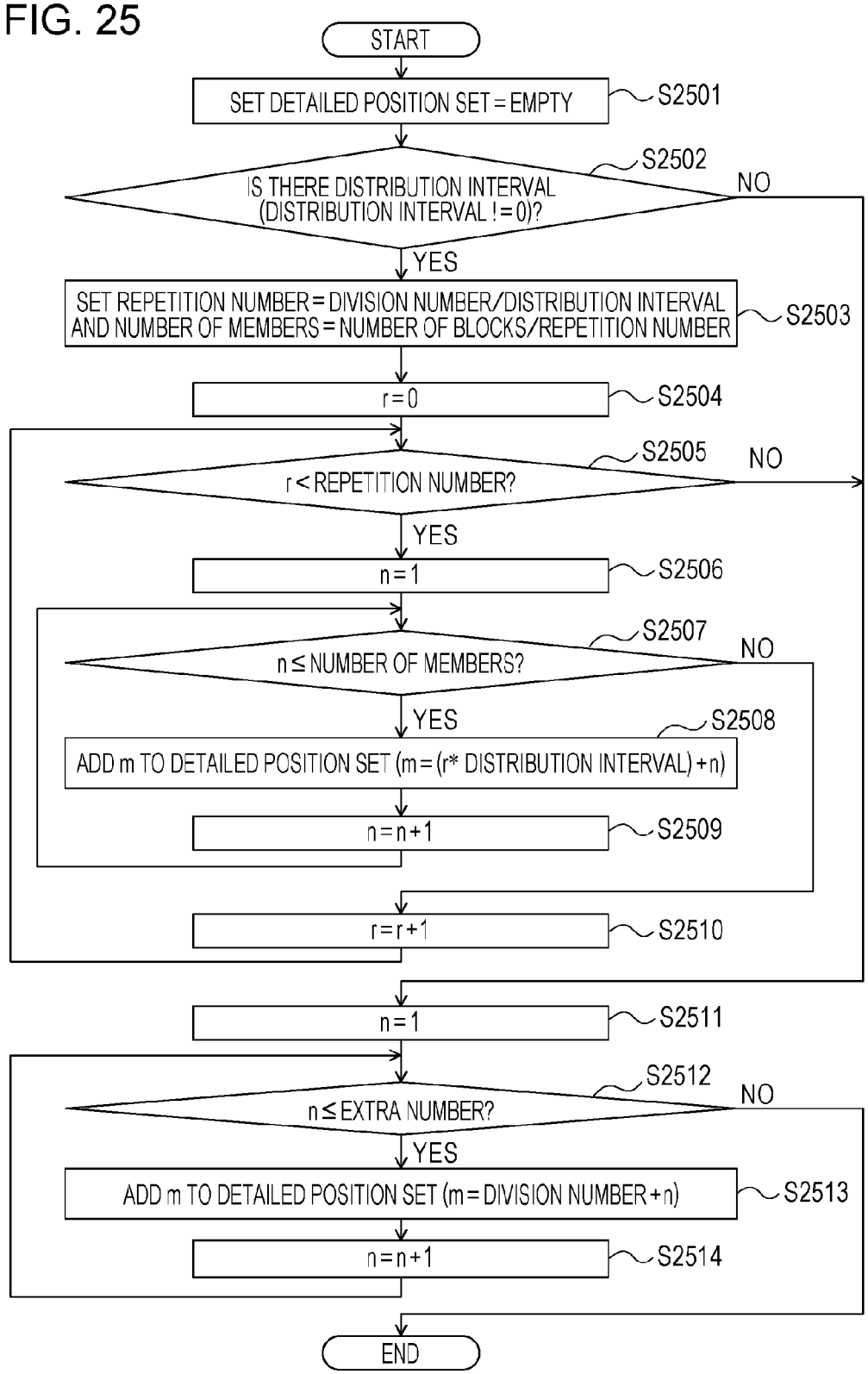
FIG. 25 is a flowchart illustrating detailed description of a detailed position set decision process (step S2107) illustrated in FIG. 21.

FIG. 25 is a flowchart illustrating detailed description of the detailed position set decision process (step S2107) illustrated in FIG. 21. First, the test pattern generation device 100 sets "detailed position set=empty" (step S2501). Next, the test pattern generation device 100 determines whether there is the distribution interval (step S2502). In step S2502, for example, the test pattern generation device 100 determines whether the distribution interval is not 0.

When the test pattern generation device 100 determines that there is no distribution interval (No in step S2502), the test pattern generation device 100 causes the process to proceed to step S2511. When the test pattern generation device 100 determines that there is the distribution interval (Yes in step S2502), the test pattern generation device 100 sets "repetition number=division number/distribution interval" and "number of members=number of blocks/repetition number" (step S2503). Next, the test pattern generation device 100 sets r=0 (step S2504). The test pattern generation device 100 determines whether "r<repetition number" is satisfied (step S2505). When the test pattern generation device 100 determines that "r<repetition number" is satisfied (Yes in step S2505), the test pattern generation device 100 sets "n=1" (step S2506).

Next, the test pattern generation device 100 determines whether "n≤number of members" is satisfied (step S2507). When the test pattern generation device 100 determines that "n≤number of members" is satisfied (Yes in step S2507), the test pattern generation device 100 adds m to the detailed position set (step S2508). In step S2508, m is "(r*distribution interval)+n". Next, the test pattern generation device 100 sets "n=n+1" (step S2509) and returns the process to step S2507.

Conversely, when the test pattern generation device 100 determines in step S2507 that "n number of members" is not satisfied (No in step S2507), the test pattern generation device 100 sets "r=r+1" (step S2510) and returns the process to step S2505.

Conversely, when the test pattern generation device 100 determines in step S2505 that "r<repetition number" is not satisfied (No in step S2505), the test pattern generation device 100 sets "n=1" (step S2511). Next, the test pattern generation device 100 determines whether "n extra number" is satisfied (step S2512). When the test pattern generation device 100 determines that "n extra number" is satisfied (Yes in step S2512), the test pattern generation device 100 adds m to the detailed position set (step S2513). In step S2513, m is "division number+n". Next, the test pattern generation device 100 sets "n=n+1" (step S2514) and returns the process to step S2512.

When the test pattern generation device 100 determines in step S2512 that "n extra number" is not satisfied (No in step S2512), the test pattern generation device 100 ends the series of processes.

Figure 26:
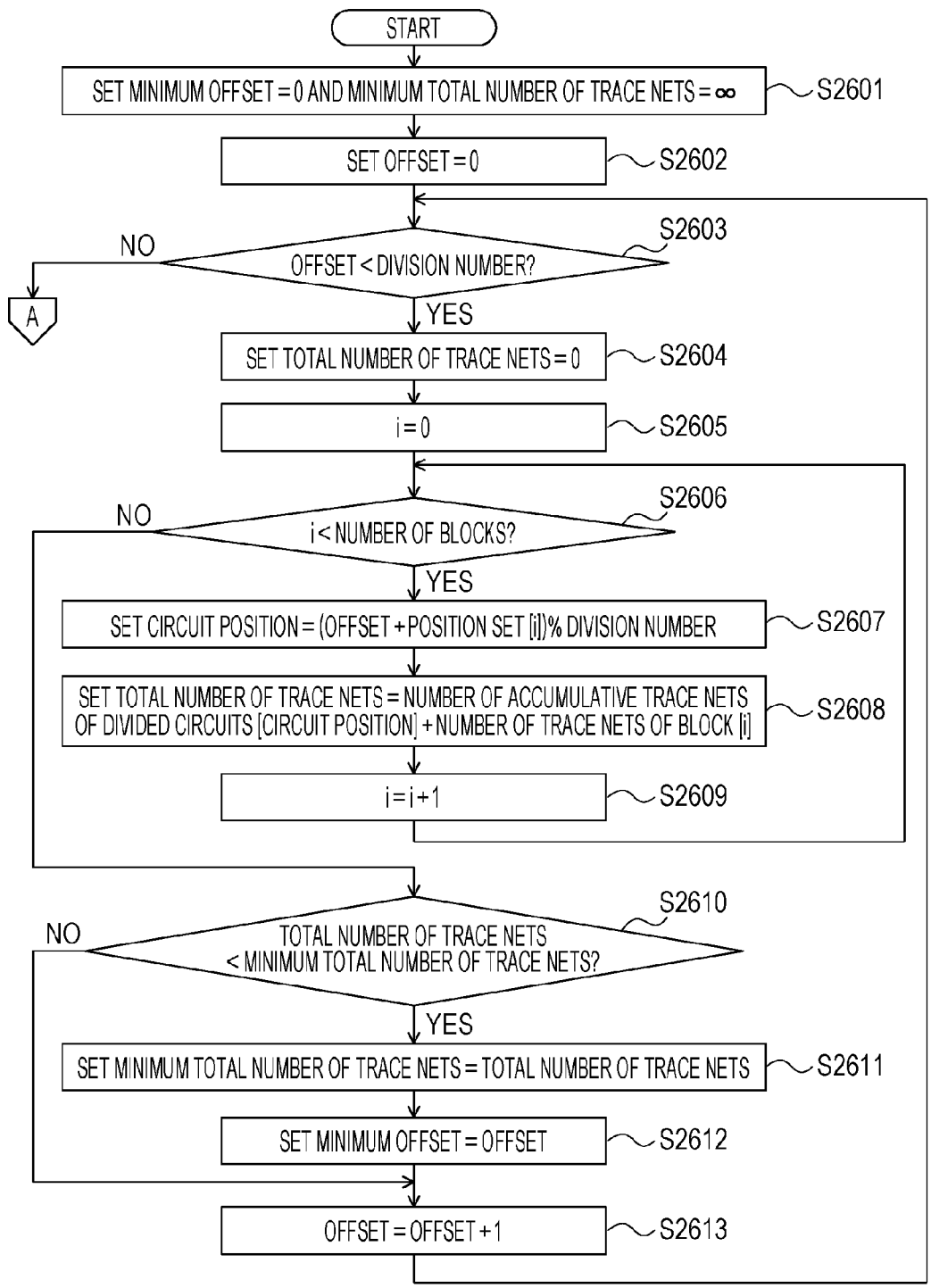
FIG. 26 is a flowchart (part 1) illustrating detailed description of a circuit division list generation process (step S2108) illustrated in FIG. 21.
Figure 27:
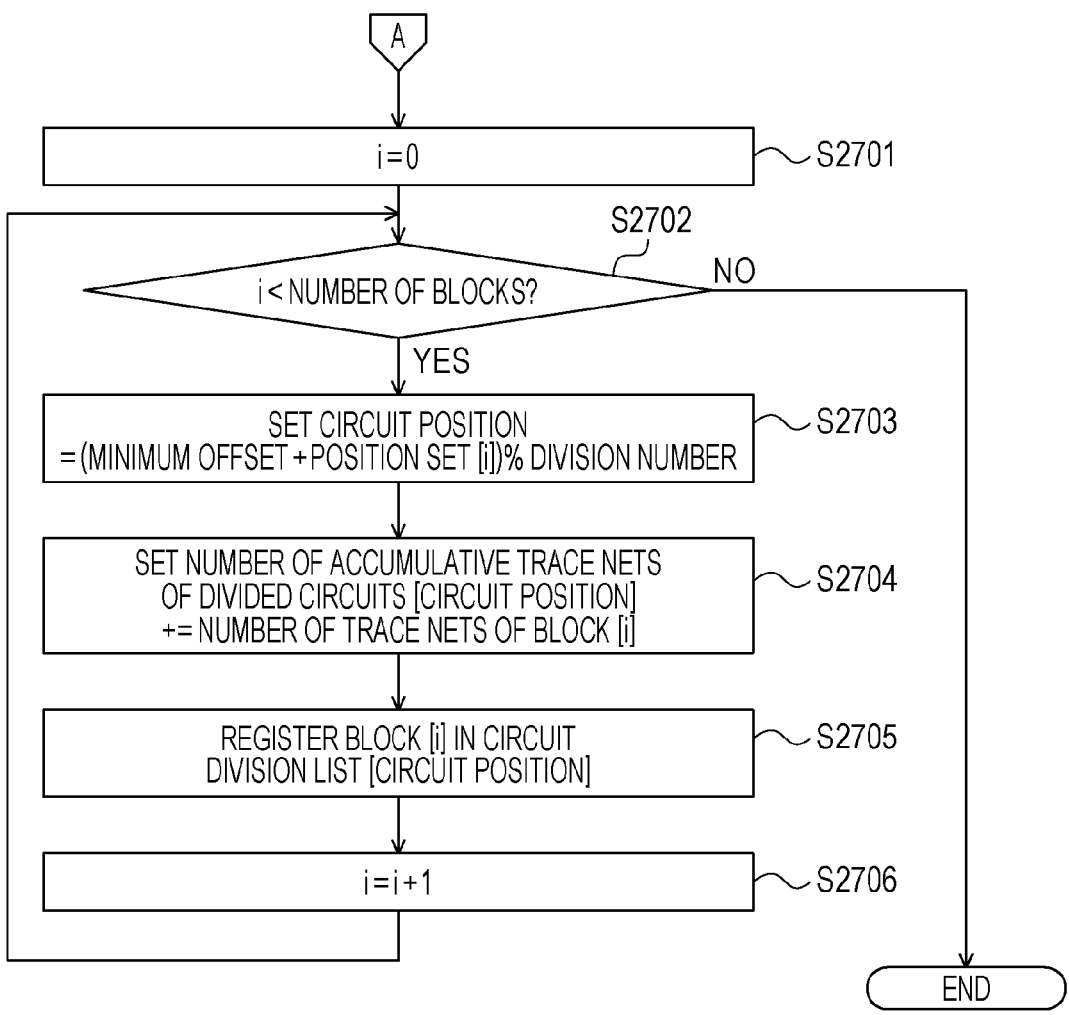
FIG. 27 is a flowchart (part 2) illustrating detailed description of the circuit division list generation process (step S2108) illustrated in FIG. 21.

FIGS. 26 and 27 are flowcharts illustrating detailed description of the circuit division list generation process (step S2108) illustrated in FIG. 21. First, the test pattern generation device 100 sets "minimum offset=0" and "minimum total number of trace nets=∞ (step S2601). The test pattern generation device 100 sets "offset=0" (step S2602).

The test pattern generation device 100 determines whether "offset<division number" is satisfied (step S2603). When the test pattern generation device 100 determines that "offset<division number" is satisfied (Yes in step S2603), the test pattern generation device 100 sets "total number of trace nets=0" (step S2604). The test pattern generation device 100 sets "i=0" (step S2605). The test pattern generation device 100 determines whether "i<number of blocks" is satisfied (step S2606).

When the test pattern generation device 100 determines that "i<number of blocks" is satisfied (Yes in step S2606), the test pattern generation device 100 sets "circuit position= (offset+position set [i]) % division number" (step S2607). The test pattern generation device 100 sets "total number of trace nets=number of accumulative number of trace nets of divided circuits [circuit position]+number of trace nets of block [i]" (step S2608). Next, the test pattern generation device 100 sets "i=i+1" (step S2609) and returns the process to step S2606.

When the test pattern generation device 100 determines in step S2606 that "i<number of blocks" is not satisfied (No in step S2606), the test pattern generation device 100 determines whether "total number of trace nets<minimum number of trace nets" is satisfied (step S2610). When the test pattern generation device 100 determines that "total number of trace nets<minimum number of trace nets" is satisfied (Yes in step S2610), the test pattern generation device 100 sets "minimum number of trace nets=total number of trace nets" (step S2611). The test pattern generation device 100 sets "minimum offset=offset" (step S2612) and causes the process to proceed to step S2613.

Conversely, when the test pattern generation device 100 determines in step S2610 that "total number of trace nets<minimum number of trace nets" is not satisfied (No in step S2610), the test pattern generation device 100 sets "offset=offset+1" (step S2613) and returns the process to step S2603.

When the test pattern generation device 100 determines in step S2603 that "offset<division number" is not satisfied (No in step S2603), the test pattern generation device 100 sets "i=0" (step S2701). The test pattern generation device 100 determines whether "i<number of blocks" is satisfied (step S2702). When the test pattern generation device 100 determines that "i<number of blocks" is satisfied (Yes in step S2702), the test pattern generation device 100 sets "circuit position=(minimum offset+position set [i]) % division number" (step S2703).

The test pattern generation device 100 sets "number of accumulative trace nets of divided circuits [circuit position]+=number of trace nets of block [i]" (step S2704). Then, the test pattern generation device 100 registers the block [i] in a circuit division list [circuit position] (step S2705). Next, the test pattern generation device 100 sets "i=i+1" (step S2706) and returns the process to step S2702. Conversely, when the test pattern generation device 100 determines in step S2702 that "i<number of blocks" is not satisfied (No in step S2702), the test pattern generation device 100 ends the series of processes.

<Clock Merging>

Finally, a merging example of a plurality of clock pulses will be described. In recent years, a processor includes a plurality of clock domains in some cases. Even when the processor include the plurality of clock domains, a clock pulse to be applied to the scan FF by an automatic test pattern generator (ATPG) after the scan is restricted to one pulse in some cases. For example, when two clock pulses are applied to a target circuit after scan, state of a scan FF is updated by first clock pulse. Therefore, in order to generate an extract test in a clock-domain crossing area, the previous stage of the scan FF should also be set as an updating target.

When there are the plurality of clock domains and each clock pulse is applied to the target circuit after the scanning, a problem arises in that test patterns are increased since the scanning and the clock application are performed again in an untested circuit. As described above, in the related art, there is a technology for supplying clock signals to scan FFs in an opposite order to a data transmission direction when a plurality of clock domains are present in a test pattern target circuit and data transmission paths are not mixed between the clock domains.

However, when there are a plurality of data transmission directions, an ATPG does not match an assumed operation at a single clock. Therefore, faults are not detectable in the ATPG in some cases. Therefore, in order to perform the application as in the related art, a problem arises in that test patterns are increased.

In the embodiment, the test pattern generation device 100 specifies the number of assumption faults which can be assumed in the data transmission directions and decides a data transmission direction at the time of test pattern generation by comparison with the specified number of faults. As the assumption fault (hereinafter simply referred to as a fault), there is a stuck-at fault in which a signal is fixed to a logic value of one of 0/1 due to short-circuit or the like in each gate terminal or a transition-delay fault in which propagation of a change at the time of a logic value change is delayed due to deterioration or the like of a transistor. The number of faults is correlated to the total number of gate terminals. In the embodiment, the test pattern generation device 100 outputs information indicating that a fault in an opposite direction to a decided data transmission direction is set as a temporary non-target of an ATPG. Thus, since a range in which the ATPG can be applied can be broadened, it is possible to reduce test patterns.

Figure 28:
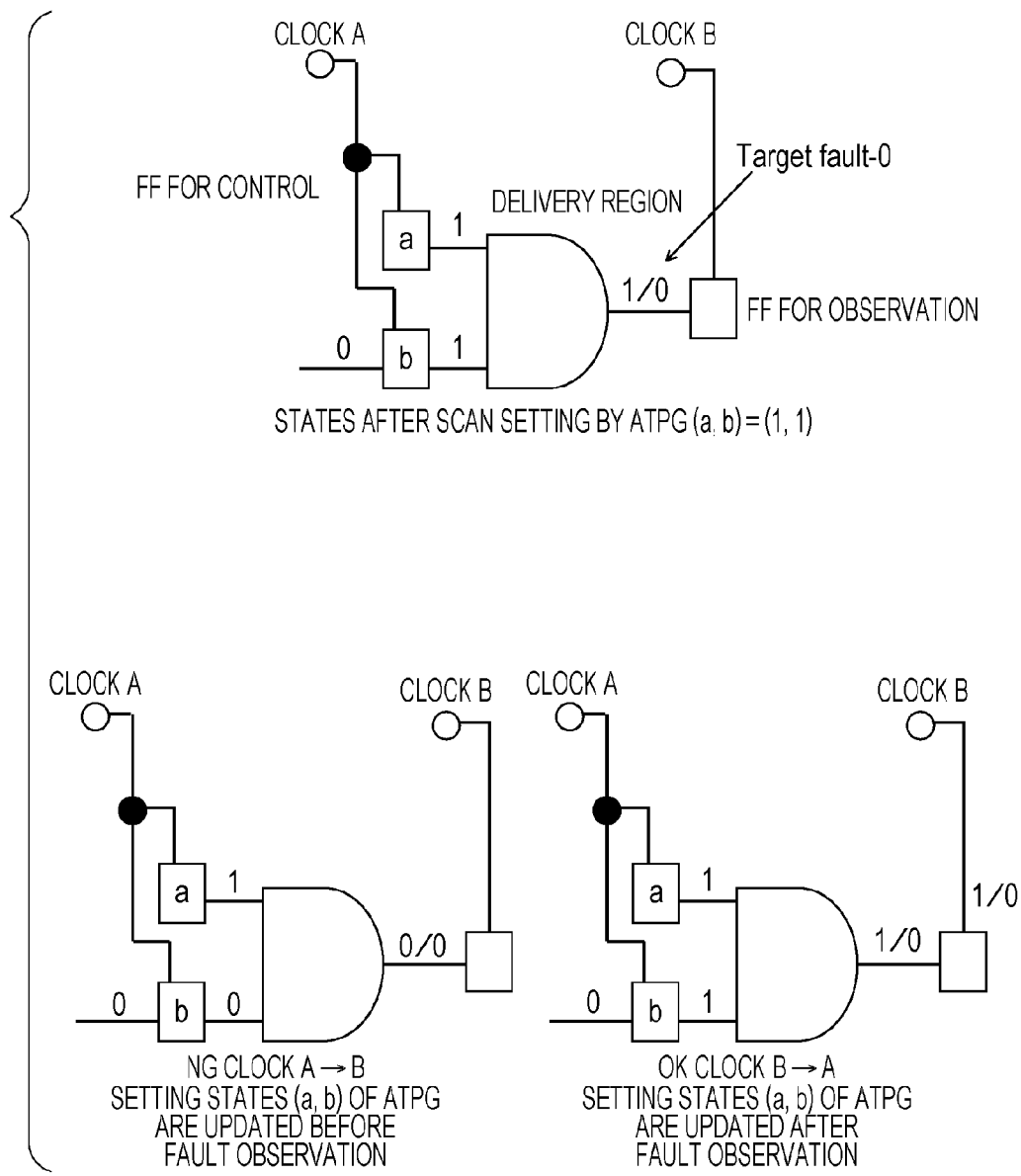
FIG. 28 is an explanatory diagram illustrating an ATPG of a signal delivery region between domains and an application order example of clock pulses.

FIG. 28 is an explanatory diagram illustrating an ATPG of a signal delivery region between domains and an application order example of clock pulses. Here, in a target circuit, a clock domain A is assumed to be present as a first clock domain and a clock domain B is assumed to be present as a second clock domain different from the first clock domain. In FIG. 28, an example in which 0 fault which is a data input of an FF for observation is detected will be given when a data signal is delivered from the clock domain A to the clock domain B.

When a clock application order is an order of the clock domain A the clock domain B, scan values of an FFa and FFb are updated by application of a clock A of the clock domain A. Therefore, setting states of the FFa and FFb are updated before fault observation.

On the other hand, when the clock application order is an order of the clock domain B→the clock domain A, a scan value of the FF for observation is updated by application of a clock B of the clock domain B. Thereafter, the scan values of the FFa and FFb are updated by application of the clock A of the clock domain A. In this way, the setting states of the FFa and FFb are updated after the fault observation. Accordingly, when the clock application order is an order of the clock domain B→the clock domain A, a test pattern for detection 0 fault of a data signal to the FF for observation can be generated.

The fault count unit 307 specifies a first number when a signal is delivered from an FF belonging to the first clock domain to an FF belonging to the second clock domain. The first number is the number of faults on a data path from the FF belonging to the first clock domain to the FF belonging to the second clock domain. The faults are also referred to as (A→B) faults.

The fault count unit 307 specifies a second number when a signal is delivered from an FF belonging to the second clock domain to an FF belonging to the first clock domain. The second number is the number of faults on a data path from the FF belonging to the second clock domain to the FF belonging to the first clock domain. The faults are also referred to as (B→A) faults.

For example, for each fault, the fault count unit 307 determines whether the clock domain A is present in the above-described marker s [net number of fault] and determines whether the clock domain B is present in the domain marker r [net number of fault]. For example, when the fault count unit 307 determines that the clock domain is present in any marker, the fault count unit 307 determines the (A→B) fault and counts up a fault counter F_AB. The result of the fault counter F_AB after the counting end is the first number.

For example, for each fault, the fault count unit 307 determines whether the clock domain A is present in the above-described domain marker s [net number of fault] and determines whether the clock domain B is present in the domain marker r [net number of fault]. For example, when the fault count unit 307 determines that the clock domain is present in any marker, the fault count unit 307 determines the (B→A) fault and counts up a fault counter F_BA. The result of the fault counter F_BA after the counting end is the second number.

The application order decision unit 308 decides an input order between the clock A of the clock domain A and the clock B of the clock domain B based on comparison of the first and second numbers. For example, when the first number is greater than the second number, the application order decision unit 308 decides an order from the clock B of the clock domain B to the clock A of the clock domain A as the input order. Conversely, for example, when the second number is greater than the first number, the application order decision unit 308 decides an order from the clock A of the clock domain A to the clock B of the clock domain B as the input order. When the first number is equal to the second number, any order may be used. The application order decision unit 308 stores the decided result of the input order as clock application order information 347 in a storage device such as the RAM 203, the ROM 202, or the disc 205.

Next, the non-target decision unit 309 generates information indicating a fault which is detectable in an opposite order to the decided input order among the faults of the terminals of the gates. For example, when the order from the clock A to clock B is decided as the input order, the non-target decision unit 309 generates non-target fault identification information 346 indicating that the (A→B) fault is set as a temporary non-target of the ATPG. For example, when the order from the clock B to clock A is decided as the input order, the non-target decision unit 309 generates the non-target fault identification information 346 indicating that the (B→A) fault is set as a temporary non-target of the ATPG. The setting of the temporary non-target means that a fault is set as a non-target during generation of the ATPG in regard to faults detectable in the decided input order.

Figure 29:
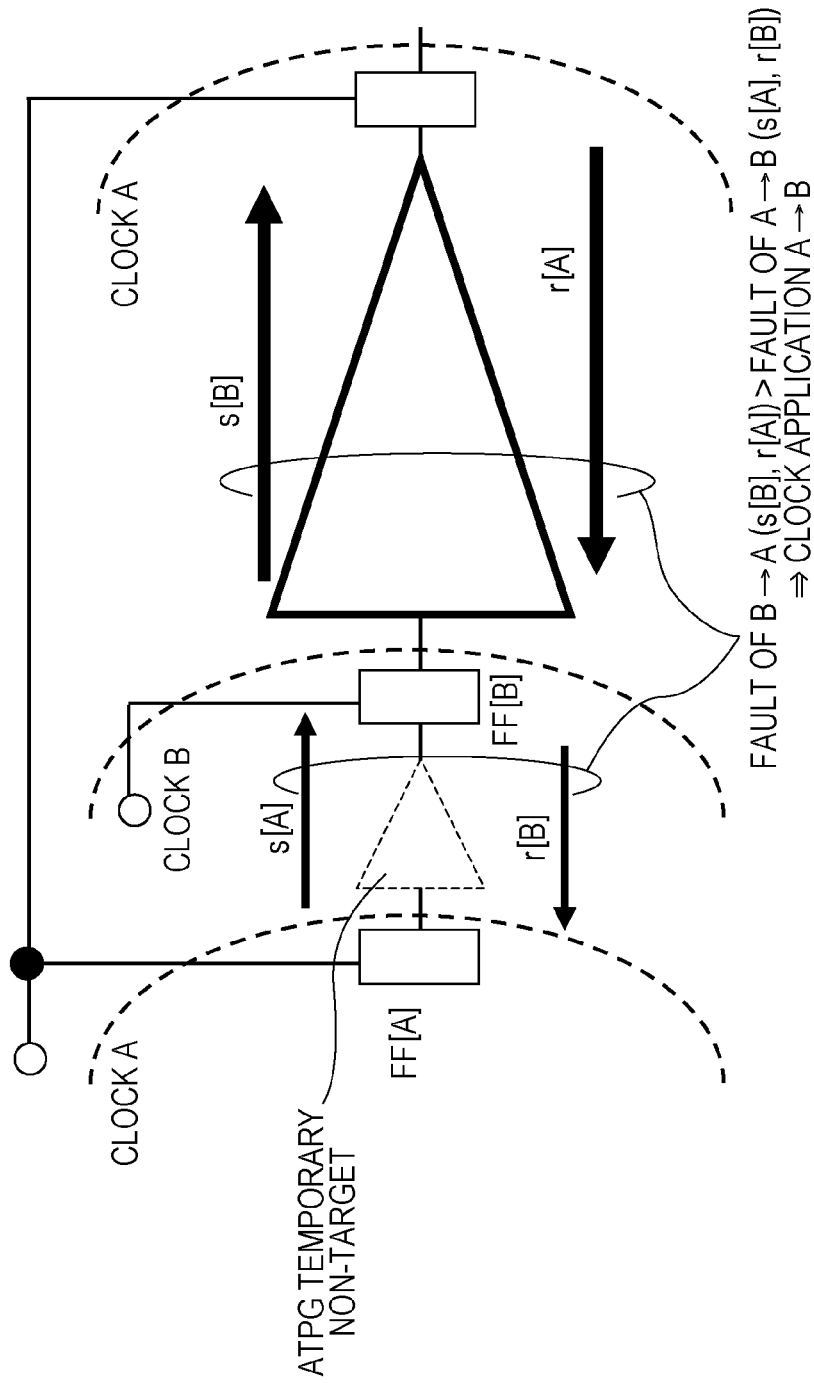
FIG. 29 is an explanatory diagram illustrating fault identification and a clock application order example.

FIG. 29 is an explanatory diagram illustrating fault identification and a clock application order example. In the example of FIG. 29, since the second number of the (B→A) fault is greater than the first number of the (A→B) fault, the application order decision unit 308 decides the clock application order from the clock A to the clock B. The non-target decision unit 309 generates the non-target fault identification information 346 indicating that a fault of a gate group on a data path from an FF(A) belonging to the clock domain A to an FF(B) belonging to the clock domain B is set as a temporary non-target of the ATPG. The non-target decision unit 309 stores the non-target fault identification information 346 in a storage device such as the RAM 203, the ROM 202, or the disc 205.

FIGS. 30A to 30C are explanatory diagrams illustrating a pattern reduction example by clock merging. FIG. 30A illustrates delivery examples of signals when the clock domains are two A and B. The number of signal deliveries are four of (A→A), (B→B), (A→B), and (B→A).

In FIG. 30A, an area indicates the number of faults, in order words, a clock application number. In the related art, the cock application number is simply a sum of the clock A of the clock domain A and the clock B of the clock domain B. Therefore, as illustrated in FIG. 30B, the clock application number in the related art is {number of (A→A)+number of (B→A)+number of (B→B)+number of (A→B)}.

On the other hand, in the embodiment, since the number of faults of (B→A)>the number of faults of (A→B), the clock application order is the order from the clock A of the clock domain A to the clock B of the clock domain B. Then, a fault {(A→A)+(B→A)} and a fault {(B→B)} become test targets by a merging clock (A→B). Accordingly, the clock application number is a sum of an application number in the merging clock and an application number in (A→B). Therefore, the clock application number is max {number of (A→A)+number of (B→B), number of (B→B)}+number of (A→B). Here, max {number of (A→A)+number of (B→A), number of (B→B)} is a larger number between the number of (A→A)+the number of (B→A) and the number of (B→B). Therefore, in the example of FIG. 30C, the number of (B→B) can be reduced.

Example of Clock Application Order Decision Process Performed by Test Pattern Generation Device 100

Figure 31:
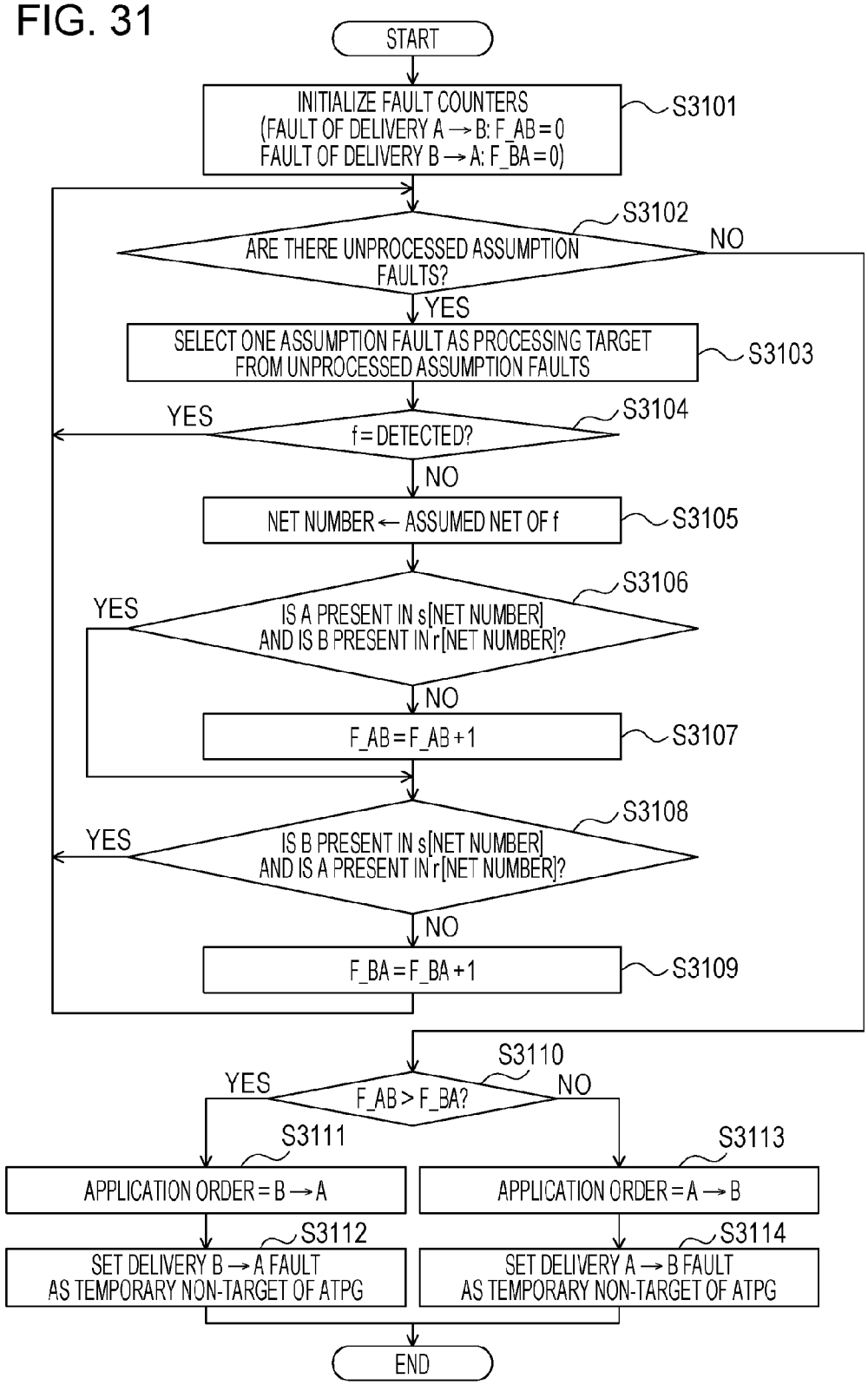
FIG. 31 is a flowchart illustrating a procedure example of a clock application order decision process performed by the test pattern generation device.

FIG. 31 is a flowchart illustrating a procedure example of a clock application order decision process performed by the test pattern generation device. Here, the clock application order decision process may be performed when a test pattern is generated. First, the test pattern generation device 100 initializes the fault counters (step S3101). In step S3101, for example, the test pattern generation device 100 sets the fault counter F_AB to 0. In step S3101, the test pattern generation device 100 sets the fault counter F_BA to 0. F_AB is a fault counter in delivery of a signal from the clock A to the clock B. F_BA is a fault counter in delivery of a signal from the clock B to the clock A.

The test pattern generation device 100 determines whether there are unprocessed assumption faults (step S3102). When the test pattern generation device 100 determines that there are the unprocessed assumption faults (Yes in step S3102), the test pattern generation device 100 selects one assumption fault as a processing target among the unprocessed assumption faults (step S3103).

The test pattern generation device 100 determines whether an assumption fault f has been detected (step S3104). When the test pattern generation device 100 determines that the assumption fault f has been detected (Yes in step S3104), the test pattern generation device 100 returns the process to step S3102. Conversely, when the test pattern generation device 100 determines that the assumption fault f has not been detected (No in step S3104), the test pattern generation device 100 set "net number assumed net of f" (step S3105). The test pattern generation device 100 determines whether A is present in s [net number] and whether B is present in r [net number] (step S3106). When the test pattern generation device 100 determines that A is present in s [net number] and B is present in r [net number] (Yes in step S3106), the test pattern generation device 100 causes the process to proceed to step S3108. When the test pattern generation device 100 determines that A is not present in s [net number] or B is not present in r [net number] (No in step S3106), the test pattern generation device 100 sets "LAB=F_AB+1" (step S3107).

Next, the test pattern generation device 100 determines whether B is present in s [net number] and A is present in r [net number] (step S3108). When the test pattern generation device 100 determines that B is present in s [net number] and A is present in r [net number] (Yes in step S3108), the test pattern generation device 100 returns the process to step S3102. Conversely, when the test pattern generation device 100 determines that B is not present in s [net number] or A is not present in r [net number] (No in step S3108), the test pattern generation device 100 sets "F_BA=F_BA+1" (step S3109) and returns the process to step S3102.

When the test pattern generation device 100 determines in step S3102 that there is no unprocessed assumption fault (No in step S3102), the test pattern generation device 100 determines whether "F_AB>F_BA" is satisfied (step S3110). When the test pattern generation device 100 determines that "F_AB>F_BA" is satisfied (Yes in step S3110), the test pattern generation device 100 sets "application order=B→A" (step S3111). The test pattern generation device 100 sets "delivery B→A fault" as a temporary non-target of the ATPG (step S3112) and ends the series of processes.

Next, when the test pattern generation device 100 determines that "F_AB>F_BA" is not satisfied (No in step S3110), the test pattern generation device 100 sets "application order=A→B" (step S3113). Then, the test pattern generation device 100 sets "delivery A→B fault" as a temporary non-target of the ATPG (step S3114) and ends the series of processes.

As described above, the test pattern generation device 100 assigns the blocks to the divided circuits based on the ratio of the division number to the number of blocks of the groups in regard to the blocks grouped based on similarity of the feature amounts regarding the scales and the functions. That is, the characteristics of the divided circuits are equalized by assigning the blocks of the groups to the divided circuits based on the ratio of the number of blocks of the groups to the number of divided circuits based on the similarity of the feature amounts regarding the scales and the functions of the blocks in the circuit. Thus, the blocks with close feature amounts may not be unevenly distributed to the same divided circuits, and thus it is possible to equalize the characteristics between the divided circuits.

The test pattern generation device 100 assigns the blocks included in the groups so that the sum value of the third feature amounts regarding the connection relation of the blocks is the minimum when the blocks are assigned to the plurality of divided circuits in accordance with the interval according to the ratio and the orders assigned to the plurality of divided circuit. Thus, it is possible to reduce a variation in the scale between the divided circuits after the division in accordance with the connection relation of the blocks.

When there is a remainder at the time of dividing the division number by the number of blocks included in the group, the test pattern generation device 100 assigns the remainder number of blocks among the blocks included in the group to the divided circuits different from the plurality of divided circuits. Since there is a high possibility of the number of extra blocks being small, the extra blocks are distributed to different divided circuits without being distributed to the plurality of divided circuits. Thus, it is possible to improve the entire performance at the time of parallel processing by the divided circuits.

The second feature amount is the number of scan FFs included in the block. Thus, the blocks assumed to have close functions or configurations can be included in the same group.

The test pattern generation device 100 deletes the redundant delay gates assigned to the data input of the target FF based on a difference value between the number of gate stages on the data path from the target FF and the FF present in the forward direction and the number of gate stages on the clock path. Thus, it is possible to reduce a circuit model while avoiding a race.

The test pattern generation device 100 deletes the redundant delay gates assigned to the data input of the target FF based on a difference value between the number of gate stages on the data path from the target FF and the FF present in the backward direction and the number of gate stages on the clock path of the FF present in the backward direction. Thus, it is possible to reduce a circuit model while avoiding a race.

When data is delivered between domains, the test pattern generation device 100 sets, as a temporary non-target of the ATPG, a fault detectable in the opposite order to the clock input order based on the number of faults between the domains in a certain transmission direction and the number of faults between the domains in an opposite transmission direction. Thus, by setting the fault undetectable in the input order as a non-target, it is possible to simultaneously perform fault detection in the input order and fault detection between the same clock domains, and thus it is possible to reduce number of times the clocks are input. Accordingly, it is possible to reduce the number of test patterns.

The circuit division method for test pattern generation described in the embodiment can be realized by causing a computer such as a personal computer or a workstation to execute a test pattern generation program prepared in advance. The circuit division program for test pattern generation is recorded on a computer-readable recording medium such as a magnetic disk, an optical disc, a universal serial bus (USB) flash memory and is read from the recording medium by a computer to be executed. The circuit division program for test pattern generation may be distributed via the network 209 such as the Internet.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A method of generating a test pattern and performing a simulation of operation of the test pattern, the method comprising:
acquiring, in regard to each of a plurality of blocks included in a target circuit for test pattern generation, a first feature amount regarding a size of each block based on circuit information indicating gates of the target circuit and a connection relation between the gates, and a second feature amount regarding a function of the block based on the circuit information;
classifying the plurality of blocks into a plurality of groups so that blocks for which the acquired first feature amount is within a first predetermined range and the acquired second feature amount is within a second predetermined range belong to an identical group;
assigning, in regard to each of the classified groups, each of the blocks included in the group to one of a plurality of divided circuits of a division number based on a ratio of the number of blocks included in the group to the division number by which the plurality of blocks are divided;
assigning the plurality of divided circuits to a plurality of computers, respectively, to generate the test pattern; and
performing a simulation of operation of the test pattern by running the plurality of computers assigned with the plurality of divided circuits in parallel.

2. The method according to claim 1,
wherein the acquiring process comprises acquiring, in regard to each of the blocks, a third feature amount regarding a path from a flip flop included in the block to a flip flop present in a forward direction of the flip flop based on the circuit information, and
wherein the assigning process comprises assigning, in regard to each of the groups, the blocks included in the group so that a sum value of the third feature amount of each of the plurality of divided circuits is minimum when each of the blocks included in the group is assigned to the plurality of divided circuits in accordance with an interval according to the ratio and a different order assigned to each of the plurality of divided circuits.

3. The method according to claim 1,
wherein the assigning process comprises assigning, when there is a remainder at a time of dividing the division number by the number of blocks included in the group, the blocks of a number of the remainder among the blocks included in the group to a divided circuit different from the plurality of divided circuits.

4. The method according to claim 1,
wherein the second feature amount is a number of flip flops for scanning included in the block.

5. The method according to claim 1, further comprising:
deriving a difference value between a number of gates on a data path from the flip flop included in a flip flop macro which is included in the block and which has a flip flop and a plurality of redundant delay gates inserted into at least one of a data input side and a data output side of the flip flop which is able to serve as a data path, to a flip flop present in a forward direction of the flip flop and a number of gates on a clock path from a clock terminal supplying a clock signal to the flip flop included in the block to the flip flop, and
wherein the circuit information indicates the gates of the target circuit including the flip flop macro from which one of the plurality of redundant delay gates is deleted based on the derived difference value and the connection relation between the gates.

6. The method according to claim 1, further comprising:
deriving a difference value between a number of gates on a data path from the flip flop included in a flip flop macro which is included in the block and which has a flip flop and a plurality of redundant delay gates inserted into at least one of a data input side and a data output side of the flip flop which is able to serve as a data path with a flip flop, to a flip flop present in a backward direction of the flip flop and a number of gates on a clock path from a clock terminal supplying a clock signal to the flip flop included in the block to the flip flop, and
wherein the circuit information indicates the gates of the target circuit including the flip flop macro from which one of the plurality of redundant delay gates is deleted based on the derived difference value and the connection relation between the gates.

7. The method according to claim 1, further comprising:
specifying, when a first clock domain and a second clock domain different from the first clock domain are present in the target circuit, a first number of faults on a data path, in a case in which a signal is delivered from a flip flop belonging to the first clock domain to a flip flop belonging to the second clock domain, from the flip flop belonging to the first clock domain to the flip flop belonging to the second clock domain, and a second number of faults on a data path, in a case in which a signal is delivered from the flip flop belonging to the second clock domain to the flip flop belonging to the first clock domain, from the flip flop belonging to the second clock domain to the flip flop belonging to the first clock domain,
deciding an input order of a first clock of the first clock domain and a second clock of the second clock domain based on comparison of the first number and the second number, and
generating information indicating a detectable fault in accordance with an opposite order to the decided input order among faults of terminals of the gates.

8. A device for generating a test pattern and simulating operation of the test pattern, comprising:
a memory; and
a processor coupled to the memory and configured to perform processes of:
acquiring, in regard to each of a plurality of blocks included in a target circuit for test pattern generation, a first feature amount regarding a size of each block based on circuit information indicating gates of the target circuit and a connection relation between the gates, and a second feature amount regarding a function of the block based on the circuit information,
classifying the plurality of blocks into a plurality of groups so that blocks for which the acquired first feature amount is within a first predetermined range and the acquired second feature amount is within a second predetermined range belong to an identical group, and
assigning, in regard to each of the classified groups, each of the blocks included in the group to one of a plurality of divided circuits of a division number into which the plurality of groups are divided, based on a ratio of the number of blocks included in the group to the division number, wherein the plurality of divided circuits are assigned to a plurality of computers, respectively, to generate the test pattern, and the plurality of computers assigned with the plurality of divided circuits run in parallel so that a simulation of operation of the test pattern is performed.

9. The device according to claim 8, wherein the processor is further configured to perform processes of:

deriving a difference value between a number of gates on a data path from a flip flop included in a flip flop macro, which is included in the block in the target circuit indicated by the circuit information and which has a flip flop and a plurality of redundant delay gates inserted into at least one of a data input side and a data output side of the flip flop which is able to serve as a data path, to a flip flop present in a forward direction of the flip flop and a number of gates on a clock path from a clock terminal supplying a clock signal to the flip flop included in the block to the flip flop; and generating second circuit information indicating the gates of the target circuit including the flip flop macro from which one of the plurality of redundant delay gates is deleted based on the derived difference value and the connection relation between the gates.

10. The device according to claim 8, wherein the processor is further configured to perform processes of:

deriving a difference value between a number of gates on a data path from the flip flop included in a flip flop macro which is included in the block in the target circuit indicated by the circuit information and which has a flip flop and a plurality of redundant delay gates inserted into at least one of a data input side and a data output side of the flip flop which is able to serve as a data path, to a flip flop present in a backward direction of the flip flop and a number of gates on a clock path from a clock terminal supplying a clock signal to the flip flop included in the block to the flip flop; and generating second circuit information indicating the gates of the target circuit including the flip flop macro from which one of the plurality of redundant delay gates is deleted based on the derived difference value and the connection relation between the gates.

11. The device according to claim 8, wherein the processor is further configured to perform processes of:

specifying, when a first clock domain and a second clock domain different from the first clock domain are present in a target circuit for test pattern generation, among faults of terminals of gates included in the target circuit, a first number of faults on a path of a signal delivered from a flip flop belonging to the first clock domain to a flip flop belonging to the second clock domain, and a second number of faults on a path of a signal delivered from the flip flop belonging to the second clock domain to the flip flop belonging to the first clock domain;

deciding an input order of a first clock of the first clock domain and a second clock of the second clock domain based on comparison of the first number and the second number; and generating information indicating a detectable fault in accordance with an opposite order to the decided input order among the faults of terminals of the gates.

12. A non-transitory and computer-readable recording medium recording a program for generating a test pattern and simulating operation of the test pattern, the program causing a computer to perform processes of:

acquiring, in regard to each of a plurality of blocks included in a target circuit for test pattern generation, a first feature amount regarding a size of each block based on circuit information indicating gates of the target circuit and a connection relation between the gates and a second feature amount regarding a function of the block based on the circuit information;

classifying the plurality of blocks into a plurality of groups so that the blocks for which the acquired first feature amount is within a first predetermined range and the acquired second feature amount is within a second predetermined range belong to an identical group; and assigning, in regard to each of the classified groups, each of the blocks included in the group to one of a plurality of divided circuits of a division number into which the plurality of groups are divided, based on a ratio of the number of blocks included in the group to the division number; and assigning the plurality of divided circuits to a plurality of computers, respectively, to generate the test pattern, wherein the plurality of computers assigned with the plurality of divided circuits run in parallel so that a simulation of operation of the test pattern is performed.

13. The non-transitory and computer-readable recording medium according to claim 12, the program further causing the computer to perform processes of:

deriving a difference value between a number of gates on a data path from a flip flop included in a flip flop macro which is included in the block in the target circuit indicated by the circuit information and which has a flip flop and a plurality of redundant delay gates inserted into at least one of a data input side and a data output side of the flip flop which is able to serve as a data path, to a flip flop present in a forward direction of the flip flop and a number of gates on a clock path from a clock terminal supplying a clock signal to the flip flop included in the block to the flip flop; and generating second circuit information indicating the gates of the target circuit including the flip flop macro from which one of the plurality of redundant delay gates is deleted based on the derived difference value and the connection relation between the gates.

14. The non-transitory and computer-readable recording medium according to claim 12, the program further causing the computer to perform processes of:

deriving a difference value between a number of gates on a data path from a flip flop included in a flip flop macro which is included in the block in the target circuit indicated by the first circuit information and which has a flip flop and a plurality of redundant delay gates inserted into at least one of a data input side and a data output side of the flip flop which is able to serve as a data path, to a flip flop present in a backward direction of the flip flop, and a number of gates on a clock path from a clock terminal supplying a clock signal to the flip flop included in the block to the flip flop; and generating second circuit information indicating the gates of the target circuit including the flip flop macro from which one of the plurality of redundant delay gates is deleted based on the derived difference value and the connection relation between the gates.

15. The non-transitory and computer-readable recording medium according to claim 12, the program further causing the computer to perform processes of:

specifying, when a first clock domain and a second clock domain different from the first clock domain are present in a target circuit for test pattern generation, among faults of terminals of gates included in the target circuit, a first number of faults on a path of a signal delivered from a flip flop belonging to the first clock domain to a flip flop belonging to the second clock domain, and a second number of faults on a path of a signal delivered from the flip flop belonging to the second clock domain to the flip flop belonging to the first clock domain;

deciding an input order of a first clock of the first clock domain and a second clock of the second clock domain based on comparison of the first number and the second number; and generating information indicating a detectable fault in accordance with an opposite order to the decided input order among the faults of terminals of the gates.

* * * * *